US012671057B2

(12) United States Patent
Yamazawa

(10) Patent No.: US 12,671,057 B2
(45) Date of Patent: Jun. 30, 2026

(54) ANTENNA FOR INDUCTIVELY COUPLED PLASMA EXCITATION, ANTENNA UNIT FOR INDUCTIVELY COUPLED PLASMA EXCITATION, AND PLASMA PROCESSING APPARATUS

(71) Applicant: Tokyo Electron Limited, Tokyo (JP)

(72) Inventor: Yohei Yamazawa, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 78 days.

(21) Appl. No.: 18/135,753

(22) Filed: Apr. 18, 2023

(65) Prior Publication Data

US 2023/0343553 A1 Oct. 26, 2023

(30) Foreign Application Priority Data

Apr. 20, 2022 (JP) ................................. 2022-069683
Mar. 7, 2023 (JP) ................................. 2023-034290

(51) Int. Cl.
*H01J 37/32* (2006.01)
(52) U.S. Cl.
CPC ..... *H01J 37/3211* (2013.01); *H01J 37/32183* (2013.01); *H01J 2237/327* (2013.01)
(58) Field of Classification Search
CPC ............. H01J 37/3211; H01J 37/32183; H01J 37/321; H01J 2237/327
See application file for complete search history.

(56) References Cited

U.S. PATENT DOCUMENTS

| | | | |
|---|---|---|---|
| 5,944,902 A | 8/1999 | Redeker et al. | |
| 6,401,652 B1 | 6/2002 | Mohn et al. | |
| 2012/0223060 A1* | 9/2012 | Yamazawa ............... | H05H 1/46 |
| | | | 219/121.43 |
| 2014/0021861 A1* | 1/2014 | Carducci ........... | H01J 37/32183 |
| | | | 315/111.51 |
| 2022/0270851 A1* | 8/2022 | Saito .................... | H01J 37/3211 |

FOREIGN PATENT DOCUMENTS

| | | | |
|---|---|---|---|
| JP | 2022061463 A | 4/2022 | |
| KR | 20220045895 A * | 4/2022 | ........ H01J 37/32174 |
| WO | 2020146189 A1 | 7/2020 | |

OTHER PUBLICATIONS

Machine Translation of KR20220045895A (Year: 2022).*

* cited by examiner

*Primary Examiner* — Raymond R Chai
(74) *Attorney, Agent, or Firm* — XSENSUS LLP

(57) ABSTRACT

The present disclosure relates to an antenna for inductively coupled plasma excitation. The antenna comprises: a conductive plate; a plurality of coil assemblies, one end of each of the plurality of coil assemblies being connected to the conductive plate; and an impedance adjusting part disposed between the other end of each of the plurality of coil assemblies and the ground.

29 Claims, 26 Drawing Sheets

ANTENNA FOR INDUCTIVELY COUPLED PLASMA EXCITATION, ANTENNA UNIT FOR INDUCTIVELY COUPLED PLASMA EXCITATION, AND PLASMA PROCESSING APPARATUS

CROSS-REFERENCE TO RELATED APPLICATIONS

This application claims priority to Japanese Patent Application Nos. 2022-069683, filed on Apr. 20, 2022, and 2023-034290, filed on Mar. 7, 2023, the entire contents of each are incorporated herein by reference.

TECHNICAL FIELD

The present disclosure relates to an antenna for inductively coupled plasma excitation, an antenna unit for inductively coupled plasma excitation, and a plasma processing apparatus.

BACKGROUND

Patent Document 1 discloses an antenna for generating plasma in a processing chamber. The antenna has two annular coil turns, i.e., a central coil turn and an outer coil turn. The central coil turn and the outer coil turn are connected by a plurality of conductors extending in a radial path or an arc path. An RF generation system including an RF source and an RF match network is connected to the central coil turn, and an RF power is supplied to the central coil turn by antenna connection. The outer coil turn is grounded by ground connection.

Patent Document 2 discloses an inductive coil antenna for inductively coupling an RF plasma source power to the plasma. The inductive coil antenna has a plurality of windings connected by a plurality of radial arms from a common antenna center. The center of the antenna is driven by an RF plasma source generator via an impedance matching circuit. Multiple outer ends of the winding are grounded.

PRIOR ART DOCUMENTS

Patent Documents

Patent Document 1: U.S. Pat. No. 5,944,902
Patent Document 2: U.S. Pat. No. 6,401,652

SUMMARY

The technique of the present disclosure improves circumferential uniformity of a magnetic field strength while improving a generation efficiency of a magnetic field by the antenna for inductively coupled plasma excitation at the time of exciting plasma using the antenna for inductively coupled plasma excitation.

The present disclosure relates to an antenna for inductively coupled plasma excitation. The antenna comprises: a conductive plate; a plurality of coil assemblies, one end of each of the plurality of coil assemblies being connected to the conductive plate; and an impedance adjusting part disposed between the other end of each of the plurality of coil assemblies and the ground.

BRIEF DESCRIPTION OF THE DRAWINGS

The objects and features of the present disclosure will become apparent from the following description of embodiments, given in conjunction with the accompanying drawings, in which.

DETAILED DESCRIPTION

Figure 1:
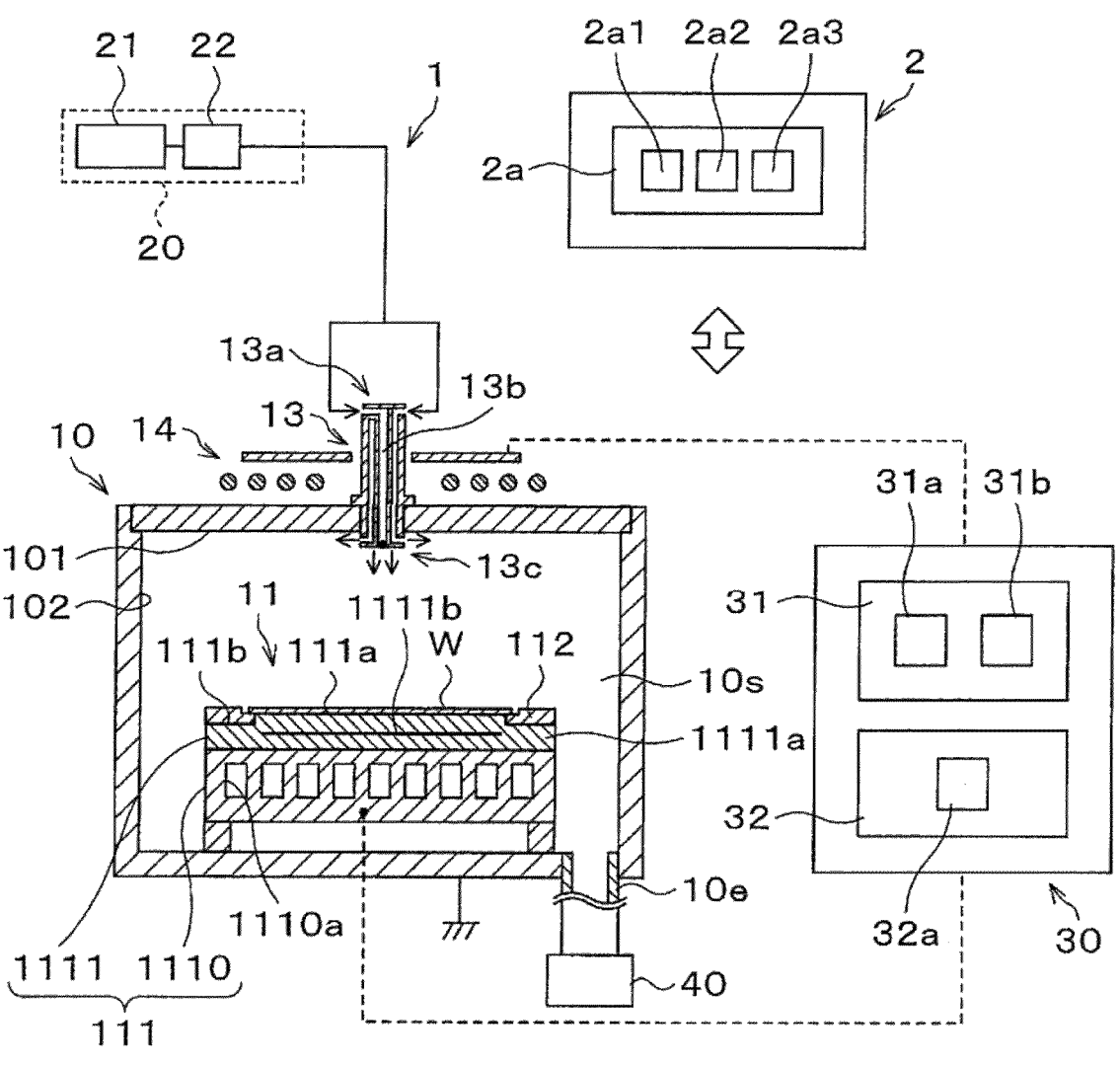
FIG. 1 is a cross-sectional view showing a schematic configuration of a plasma processing system.

In a semiconductor device manufacturing process, plasma processing such as etching, film formation, or the like is performed on a semiconductor substrate. In the plasma processing, the semiconductor substrate is processed by plasma generated by exciting a processing gas.

Inductively coupled plasma (ICP) may be used as one of plasma sources, for example. Each of the antennas for exciting inductively coupled plasma, which are disclosed in Patent Document 1 and Patent Document 2, includes a plurality of coils.

An RF power supply or an impedance matching circuit connected to the antenna is expensive. Therefore, conventionally, as disclosed in Patent Document 1 and Patent Document 2, for example, the RF power from the RF power supply or the impedance matching circuit is supplied only to the center of the antenna, and the current is branched from the center of the antenna to a plurality of coils through branch lines. In that case, the branch lines to the coils are close at the branch portion at the center of the antenna, so that inductive coupling occurs and a current distribution ratio is biased. The inductive coupling includes, e.g., a case where the RF power supply line and the branch lines are inductively coupled or a case where the branch lines are inductive coupled with each other. Accordingly, the circumferential uniformity of the strength of the magnetic field generated by the antenna deteriorates.

An opening into which a central gas injector (CGI) that is a passage of a processing gas is inserted may be formed at the center of the antenna. In that case, magnetic force lines are generated at the opening formed at the center of the antenna, so that a dielectric electromotive force is generated. Hence, the generation efficiency of the magnetic field by the antenna deteriorates.

The technique of the present disclosure improves the circumferential uniformity of the magnetic field strength while improving the generation efficiency of the magnetic field by the antenna for inductively coupled plasma excitation at the time of exciting plasma using the antenna.

Hereinafter, a plasma processing apparatus and the antenna for inductively coupled plasma excitation according to embodiments will be described with reference to the accompanying drawings. Like reference numerals will be given to like or corresponding parts throughout this specification and the drawings, and redundant description thereof will be omitted.

Configuration of Plasma Processing System

Hereinafter, a configuration example of the plasma processing system will be described. FIG. 1 is a cross-sectional view showing a schematic configuration of the plasma processing system. In the plasma processing system of the present embodiment, plasma processing is performed on a substrate (wafer) W using inductively coupled plasma. The substrate W to be subjected to the plasma processing is not limited to a wafer.

The plasma processing system includes an inductively coupled plasma processing apparatus 1 and a controller 2. The inductively coupled plasma processing apparatus 1 includes a plasma processing chamber 10, a gas supply part 20, a power supply 30, and an exhaust system 40. The plasma processing chamber 10 includes a dielectric window 101 and a sidewall 102. The plasma processing apparatus 1 further includes a substrate support 11, a gas inlet portion, an inductively coupled plasma excitation antenna unit (antenna unit) 14, and a conductor plate 15. The antenna unit 14 includes an inductively coupled plasma excitation antenna. The substrate support 11 is disposed in the plasma processing chamber 10. The antenna unit 14 is disposed on or above the plasma processing chamber 10 (i.e., on or above the dielectric window 101) to surround a central gas injector 13 to be described later. The antenna unit 14 may be disposed to surround another hollow member such as an EPD window or the like. In this case, another hollow member is partially or entirely made of an insulating material such as quartz. The insulating material may be a ceramic material other than quartz. The conductor plate 15 is disposed above the antenna unit 14. The antenna unit 14 will be described in detail later. The plasma processing chamber 10 has a plasma processing space 10s defined by the dielectric window 101, the sidewall 102, and the substrate support 11. The plasma processing chamber 10 has at least one gas supply port for supplying at least one processing gas to the plasma processing space 10s, and at least one gas exhaust port for exhausting a gas from the plasma processing space 10s. The plasma processing chamber 10 is grounded.

The substrate support 11 includes a main body 111 and a ring assembly 112. The main body 111 has a central region 111*a* for supporting the substrate W and an annular region 111*b* for supporting the ring assembly 112. A wafer is an example of a substrate W. The annular region 111*b* of the main body 111 surrounds the central region 111*a* of the main body 111 in plan view. The substrate W is disposed on the central region 111*a* of the main body 111, and the ring assembly 112 is disposed on the annular region 111*b* of the main body 111 to surround the substrate W on the central region 111*a* of the main body 111. Therefore, the central region 111*a* is also referred to as a substrate supporting surface for supporting the substrate W, and the annular region 111*b* is also referred to as a ring supporting surface for supporting the ring assembly 112.

In one embodiment, the main body 111 includes a base 1110 and an electrostatic chuck 1111. The base 1110 includes a conductive member. The conductive member of the base 1110 functions as a bias electrode. The electrostatic chuck 1111 is disposed on the base 1110. The electrostatic chuck 1111 includes a ceramic member 1111*a* and an electrostatic electrode 1111*b* disposed in the ceramic member 1111*a*. The ceramic member 1111*a* has a central region 111*a*. In one embodiment, the ceramic member 1111*a* also has an annular region 111*b*. Another member surrounding the electrostatic chuck 1111, such as an annular electrostatic chuck or an annular insulating member, may have the annular region 111*b*. In this case, the ring assembly 112 may be disposed on the annular electrostatic chuck or the annular insulating member, or may be disposed on both the electrostatic chuck 1111 and the annular insulating member. Further, at least one RF/DC electrode coupled to a radio frequency (RF) power supply 31 and/or a direct current (DC) power supply 32, which will be described later, may be disposed in the ceramic member 1111*a*. In this case, at least one RF/DC electrode functions as a bias electrode. The conductive member of the base 1110 and at least one RF/DC electrode may function as a plurality of bias electrodes. The electrostatic electrode 1111*b* may function as a bias electrode. Accordingly, the substrate support 11 includes at least one bias electrode.

The ring assembly 112 includes one or multiple annular members. In one embodiment, the one or multiple annular members include one or multiple edge rings and at least one cover ring. The edge ring is made of a conductive material or an insulating material, and the cover ring is made of an insulating material.

The substrate support 11 may include a temperature control module configured to adjust at least one of the electrostatic chuck 1111, the ring assembly 112, and the substrate W to a target temperature. The temperature control module may include a heater, a heat transfer medium, a flow path 1110*a*, or a combination thereof. A heat transfer fluid such as brine or a gas flows through the flow path 1110*a*. In one embodiment, the flow path 1110*a* is formed in the base 1110, and one or multiple heaters are disposed in the ceramic member 1111*a* of electrostatic chuck 1111. The substrate support 11 may include a heat transfer gas supply part configured to supply a heat transfer gas to a space between the backside of the substrate W and the central region 111*a*.

The gas inlet portion is configured to introduce at least one processing gas from the gas supply part 20 into the plasma processing space 10*s*. In one embodiment, the gas inlet portion includes the central gas injector (CGI) 13. The central gas injector 13 is disposed above the substrate support 11 and attached to a central opening formed in the dielectric window 101. The central gas injector 13 has at least one gas supply port 13*a*, at least one gas flow path 13*b*, and at least one gas inlet port 13*c*. The processing gas supplied to the gas supply port 13*a* passes through the gas flow path 13*b* and is introduced into the plasma processing space 10*s* from the gas inlet port 13*c*. The gas inlet portion may include, in addition to or instead of the central gas injector 13, one or multiple side gas injectors (SGI) attached to one or multiple openings formed in the sidewall 102.

The gas supply part 20 may include at least one gas source 21 and at least one flow rate controller 22. In one embodiment, the gas supply part 20 is configured to supply at least one processing gas from the corresponding gas source 21 to the gas inlet portion through the corresponding flow rate controller 22. The flow rate controllers 22 may include, e.g., a mass flow controller or a pressure-controlled flow rate controller. Further, the gas supply part 20 may include one or more flow rate modulation devices for modulating the flow rate of at least one processing gas or causing it to pulsate.

The power supply 30 includes an RF power supply 31 connected to the plasma processing chamber 10 through at least one impedance matching circuit. The RF power supply 31 is configured to supply at least one RF signal (RF power) to at least one bias electrode and the antenna unit 14. Accordingly, plasma is produced from at least one processing gas supplied to the plasma processing space 10*s*. Therefore, the RF power supply 31 may function as at least a part of a plasma Generator configured to generate plasma from one or more processing gases in the plasma processing chamber 10. Further, by supplying the bias RF signal to at least one bias electrode, a bias potential is generated at the substrate W, and ions in the produced plasma can be attracted to the substrate W.

In one embodiment, the RF power supply 31 includes a first RF generator 31*a* and a second RF generator 31*b*. The first RF generator 31*a* is connected to the antenna unit 14 and is configured to generate a source RF signal (source RF power) for plasma generation through at least one impedance matching circuit. In one embodiment, the source RF signal has a frequency within a range of 10 MHz to 150 MHz. In one embodiment, the first RF generator 31*a* may be configured to generate a plurality of source RF signals having different frequencies. The generated single or multiple source RF signals are supplied to the antenna unit.

The second RF generator 31*b* is connected to at least one bias electrode through at least one impedance matching circuit, and is configured to generate a bias RF signal (bias RF power). The frequency of the bias RF signal may be the same as or different from the frequency of the source RF signal. In one embodiment, the bias RF signal has a frequency lower than that of the source RF signal. In one embodiment, the bias RF signal has a frequency within a range of 100 kHz to 60 MHz. In one embodiment, the second RD generator 31*b* may be configured to generate a plurality of bias RF signals having different frequencies. The generated single or multiple bias RF signals are supplied to at least one bias electrode. Further, in various embodiments, at least one of the source RF signal and the bias RF signal may be pulsated.

Further, the power supply 30 may include a DC power supply 32 connected to the plasma processing chamber 10. The DC power supply 32 includes a bias DC generator 32*a*. In one embodiment, the bias DC generator 32*a* is connected to at least one bias electrode and is configured to generate a bias DC signal. The generated bias DC signal is applied to at least one bias electrode.

In various embodiments, the bias DC signal may be pulsated. In this case, a sequence of voltage pulses is applied to at least one bias electrode. The voltage pulse may have a rectangular pulse waveform, a trapezoidal pulse waveform, a triangular pulse waveform, or a combination thereof. In one embodiment, a waveform generator for generating a sequence of voltage pulses from the DC signal is connected between the bias DC generator 32a and the at least one bias electrode. Therefore, the bias DC generator 32a and the waveform generator constitute a voltage pulse generator. The voltage pulse may have positive polarity or negative polarity. Further, the sequence of voltage pulses may include one or more positive voltage pulses and one or more negative voltage pulses in one cycle. The bias DC generator 32a may be provided in addition to the RF power supply 31, or may be provided instead of the second RF generator 31b.

The exhaust system 40 may be connected to a gas outlet 10e disposed at a bottom portion of the plasma processing chamber 10, for example. The exhaust system 40 may include a pressure control valve and a vacuum pump. The pressure control valve adjusts a pressure in the plasma processing space 10s. The vacuum pump may include a turbo molecular pump, a dry pump, or a combination thereof.

The controller 2 processes computer-executable instructions that cause the plasma processing apparatus 1 to perform various steps described in the present disclosure. The controller 2 may be configured to control individual components of the plasma processing apparatus 1 to perform various steps described herein. In one embodiment, a part or all of the controller 2 may be included in the plasma processing apparatus 1. The controller 2 may include a processing part 2a1, a storage part 2a2, and a communication interface 2a3. The controller 2 is realized by a computer 2a, for example. The processing part 2a1 may be configured to read a program from the storage part 2a2 and execute various control operations by executing the read program. The program may be stored in the storage part 2a2 in advance, or may be obtained via a medium when necessary. The obtained program is stored in the storage part 2a2, and read from the storage part 2a2 and executed by the processing part 2a1. The medium may be various storage media that can be read by the computer 2a, or may be a communication line connected to the communication interface 2a3. The processing part 2a1 may be a central processing unit (CPU). The storage part 2a2 may include a random access memory (RAM), a read only memory (ROM), a hard disk drive (HDD), a solid state drive (SSD), or a combination thereof. The communication interface 2a3 may communicate with the plasma processing apparatus 1 through a communication line such as a local area network (LAN) or the like.

First Embodiment

Figure 2:
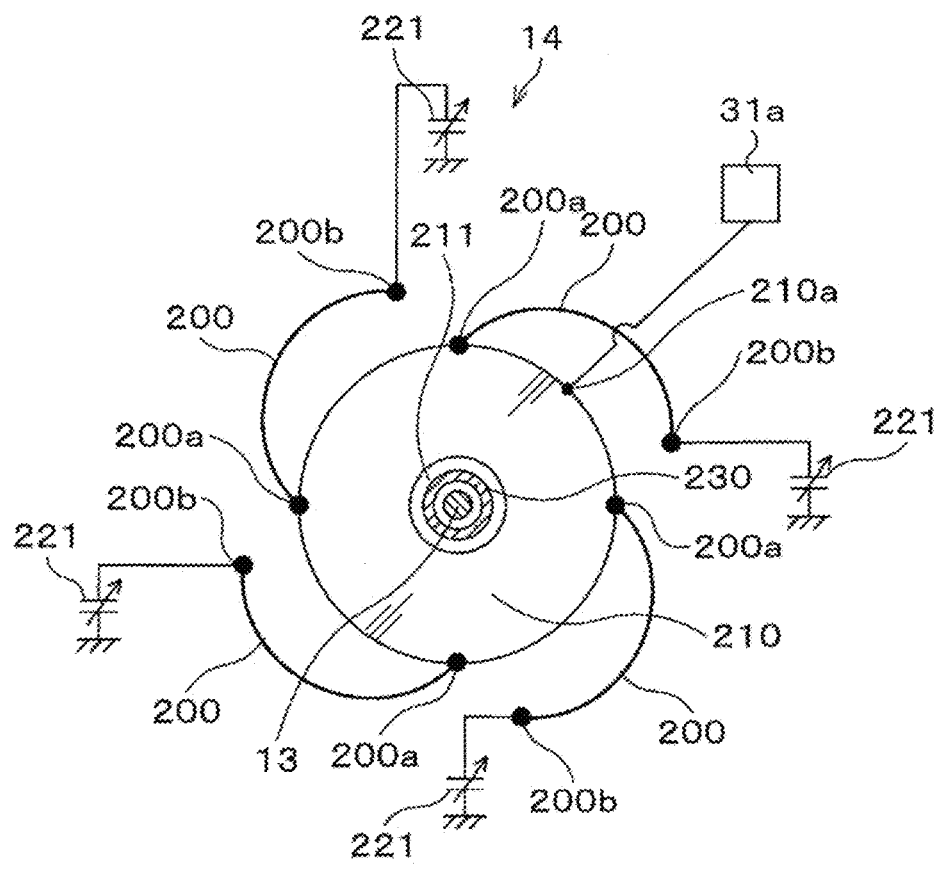
FIG. 2 is a bottom plan view showing a schematic configuration of an antenna unit according to a first embodiment.
Figure 3:
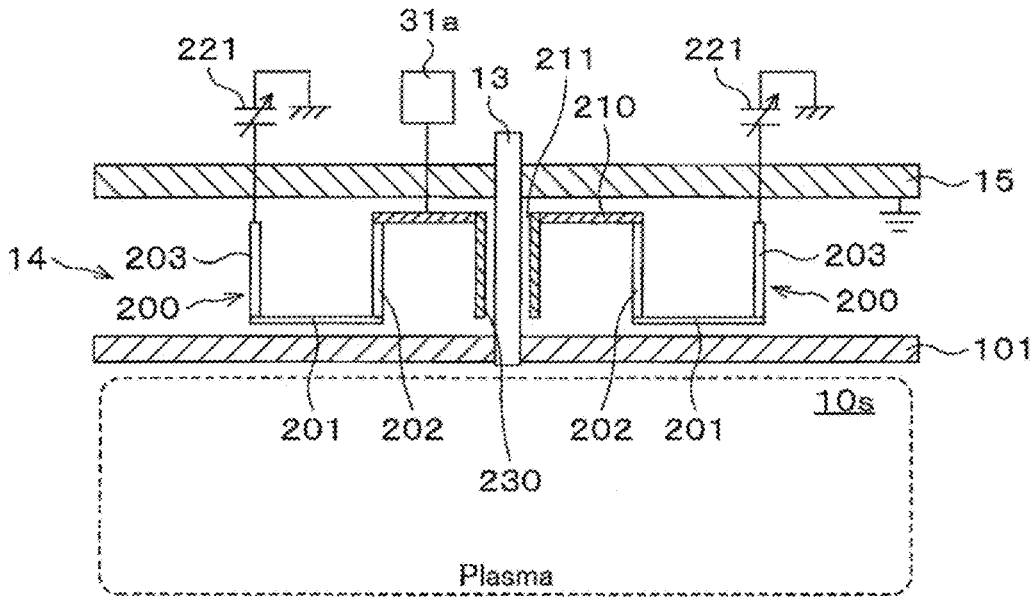
FIG. 3 is a cross-sectional view showing the schematic configuration of the antenna unit according to the first embodiment.
Figure 4:
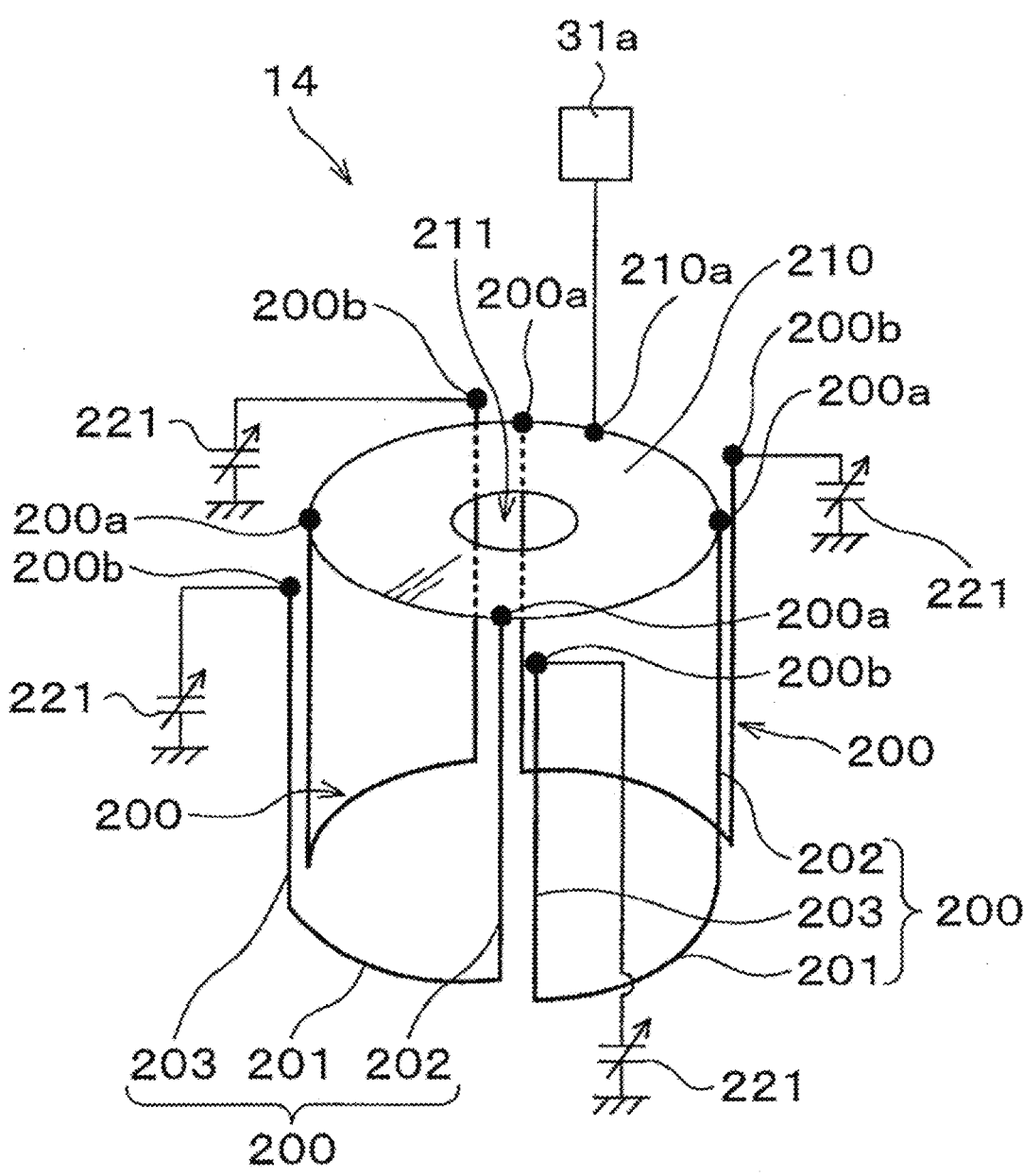
FIG. 4 is a perspective view schematically showing the schematic configuration of the antenna unit according to the first embodiment.

Next, a configuration example of the antenna unit 14 according to a first embodiment will be described. FIG. 2 is a bottom plan view showing a schematic configuration of the antenna unit 14. FIG. 3 is a cross-sectional view showing the schematic configuration of the antenna unit 14. FIG. 4 is a perspective view showing the schematic configuration of the antenna unit 14.

The antenna unit 14 includes at least one antenna. In the present embodiment, the antenna unit 14 includes an antenna having a plurality of coil assemblies 200, a conductive plate 210, and a conductive cylindrical portion (conductive hollow member) 230.

In the illustrated example, four coil assemblies 200 are illustrated. However, the number of coil assemblies 200 is not particularly limited. The coil assemblies 200 are arranged above the dielectric window 101. Further, the coil assemblies 200 are arranged at equal intervals in the circumferential direction of the conductive plate 210, and are arranged at rotationally symmetrical positions with respect to the center. The term "rotational symmetry" has a general meaning, and refers to the arrangement that coincides with the original arrangement when rotated by (360/n)° (n being an integer of 2 or more) around the center. Specifically, in the illustrated example, the four coil assemblies 200 are arranged at equal intervals in the circumferential direction of the conductive plate 210, and the four coil assemblies 200 are arranged to coincide with the original arrangement when rotated by 90° with respect to the center of the conductive plate 210.

Each coil assembly 200 has a coil segment 201 and vertical coil segments 202 and 203. The coil segment 201 extends in a horizontal direction or extends obliquely with respect to the horizontal direction, and is disposed at a bottom portion of the coil assembly 200. The coil segment 201 is also referred to as a plasma facing segment, since it faces the plasma processing space 10s and extends in the horizontal direction. One vertical coil segment 202 extends upward from the coil segment 201 and is connected to the outer periphery of the inner conductive plate 210 through the coil terminal 200a. Another vertical coil segment 202 may be connected to the upper surface or the bottom surface of the conductive plate 210. The other vertical coil segment 203 extends upward from the coil segment 201 and is connected to the ground potential from a coil terminal 200b through an impedance adjusting part. In the illustrated example, the impedance adjusting part is a capacitor 221. The capacitor 221 is a variable capacitance capacitor. However, the configuration of the capacitor 221 is not limited thereto, and the capacitor 221 may be a capacitor having a fixed capacitance, or may include multiple capacitors including a variable capacitance capacitor and/or a fixed capacitance capacitor. However, it is preferable to include at least one variable capacitance capacitor. The impedance adjusting part may include a variable resistor and a variable inductor. Since, however, the resistor or the inductor deteriorates the efficiency of the high frequency power, it is preferable that the impedance adjusting part includes a capacitance capacitor.

The conductive plate 210 is disposed above the coil assemblies 200. In other words, the conductive plate 210 is separated from the plasma processing space 10s where plasma is generated, and is disposed near the conductor plate 15. Further, the conductive plate 210 is disposed around the substantially cylindrical central gas injector 13 to surround the central gas injector 13. The conductive plate 210 has a substantially circular shape in plan view, and has a central opening 211. The shape of the conductive plate 210 is not particularly limited, and the conductive plate 210 may have a polygonal shape, for example. Preferably, the conductive plate 210 has a rotationally symmetrical shape. When the conductive plate 210 has a polygonal shape, the number of vertices is preferably an integer multiple of the number of coil assemblies 200. The central gas injector 13 is inserted into the central opening 211. A central plate terminal 210a is disposed on the upper surface or the conductive plate 210. The central plate terminal 210a may be disposed on the bottom surface of the conductive plate 210. The central plate terminal 210a is connected to the first RF generator 31a of the power source 30. In other words, the central plate terminal 210*a* is connected to the RF potential. The central plate terminal 210*a* may be directly connected to the RF potential, or may be connected to the RF potential through an electric element such as a capacitor, a coil, or the like. In other words, the central plate terminal 210*a* is directly or indirectly connected to the RF potential.

The conductive cylindrical portion 230 is disposed around the central gas injector 13 to surround the central gas injector 13 inside the central opening 211. The conductive cylindrical portion 230 extends downward from the central opening 211 to a position on or below the dielectric window 101. The conductive cylindrical portion 230 may be connected to the inner conductive plate 210, or may not be connected to the inner conductive plate 210. In other words, the conductive cylindrical portion 230 may be separated from the inner conductive plate 210. Further, the conductive cylindrical portion 230 may be a part of the central gas injector 13.

Action of Antenna

In the antenna unit 14 configured as described above, the RF power supplied from the first RF generator 31*a* of the power supply 30 is supplied to the inner conductive plate 210 through the central plate terminal 210*a*. Accordingly, the current branches from the inner conductive plate 210 and flows to the coil assemblies 200. A magnetic field is generated in a vertical axis direction by this current, and an induced electric field is generated in the plasma processing chamber by the generated magnetic field. Due to the induced electric field generated in the plasma processing chamber 10, plasma is produced from the processing gas supplied from the central gas injector 13 into the plasma processing chamber 10. Then, plasma processing such as etching, film formation, or the like is performed on the substrate W on the central region 111*a* by ions or active species in the plasma.

Effect 1 of Antenna

Conventionally, as described above, in the case of branching the current from the center of the antenna to the plurality of coils through the branch lines, the magnetic force lines freely pass between the coils, so that a dielectric electromotive force is generated and the generation efficiency of the magnetic field by the antenna deteriorates. On the other hand, in the antenna unit 14 of the first embodiment, the plate-shaped inner conductive plate 210 does not allow the passage of the magnetic force lines, which makes it possible to suppress the inflow of extra magnetic force lines. In other words, the inner conductive plate 210 can be prevented from functioning as a coil. Accordingly, the magnetic field generation efficiency can be improved.

The inner conductive plate 210 is disposed near the conductor plate 15. For example, the distance between the inner conductive plate 210 and the conductor plate 15 is smaller than the diameter of the central opening 211. Therefore, the inflow of the magnetic force lines can be further suppressed.

At the central opening 211, the gap between the inner end portion of the inner conductive plate 210 and the central gas injector 13 is preferably small in order to suppress the inflow of the magnetic force lines. In the first embodiment, the gap therebetween is 20 mm or less, which is a distance required to secure a normally required withstand voltage of the coil, e.g., 20 kV.

Since the conductive cylindrical portion 230 is disposed at the central opening 211, the gap in the central opening 211 can be reduced, and the inflow of the magnetic force lines can be further suppressed.

Effect 2 of Antenna

Conventionally, as described above, in the case of branching the current from the center of the antenna to the coils through the branch line, the branch lines are close to each other at the branch portion corresponding to the center of the antenna, so that the induction coupling occurs and the current distribution ratio is biased. Accordingly, the circumferential uniformity of the strength of the magnetic field generated by the antenna deteriorates. On the other hand, in the antenna unit 14 of the first embodiment, the plate-shaped inner conductive plate 210 serves as the current branching portion, so that the induction coupling does not occur and there is no bias in the ratio of the current distribution to the coil assemblies 200. Hence, the circumferential uniformity of the magnetic field strength can be improved.

The coil assemblies 200 are arranged at equal intervals in the circumferential direction of the conductive plate 210 and are arranged at rotationally symmetrical positions with respect to the center of the conductive plate 210. In that case, the bias of the ratio of the current distribution to the coil assemblies 200 can be further suppressed.

Effect 3 of Antenna

The coil assemblies 200 are respectively connected to the capacitors 221 via the coil terminals 200*b*. When the current distribution ratio is biased, it is possible to further suppress the current distribution ratio bias by controlling the impedance by changing the capacitance of one or multiple capacitors 221. Therefore, the capacitor 221 that is a variable capacitance capacitor may be connected to the controller 2 so that the controller 2 can perform control such as changing the capacitance or the like. Further, it is not necessary to change the capacitances of all the capacitors 221 connected to all the coil assemblies 200 in order to suppress the bias in the current distribution ratio. The bias in the current distribution ratio may be suppressed by changing the capacitance of at least one capacitor 221. Therefore, in order to obtain this effect, at least one of the capacitors 221 may be a variable capacitance capacitor, and the other capacitors 221 may be fixed capacitance capacitors. Further, in addition to the capacitor 221, a desired impedance adjusting part capable of adjusting the impedance in the coil assembly 200 may be provided.

Second Embodiment

Figure 5:
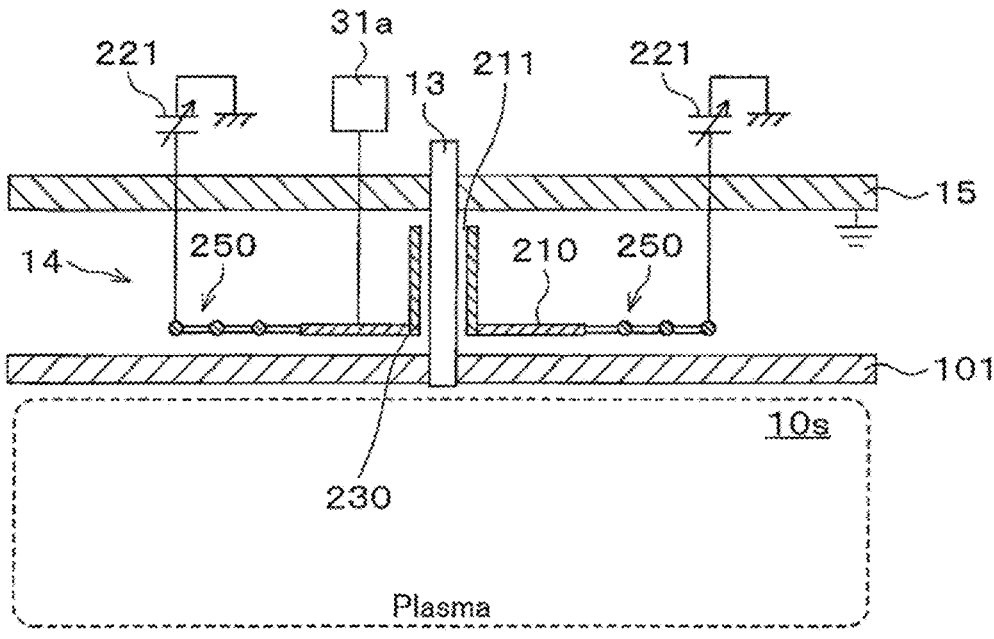
FIG. 5 is a cross-sectional view showing a schematic configuration of an antenna unit according to a second embodiment.
Figure 6:
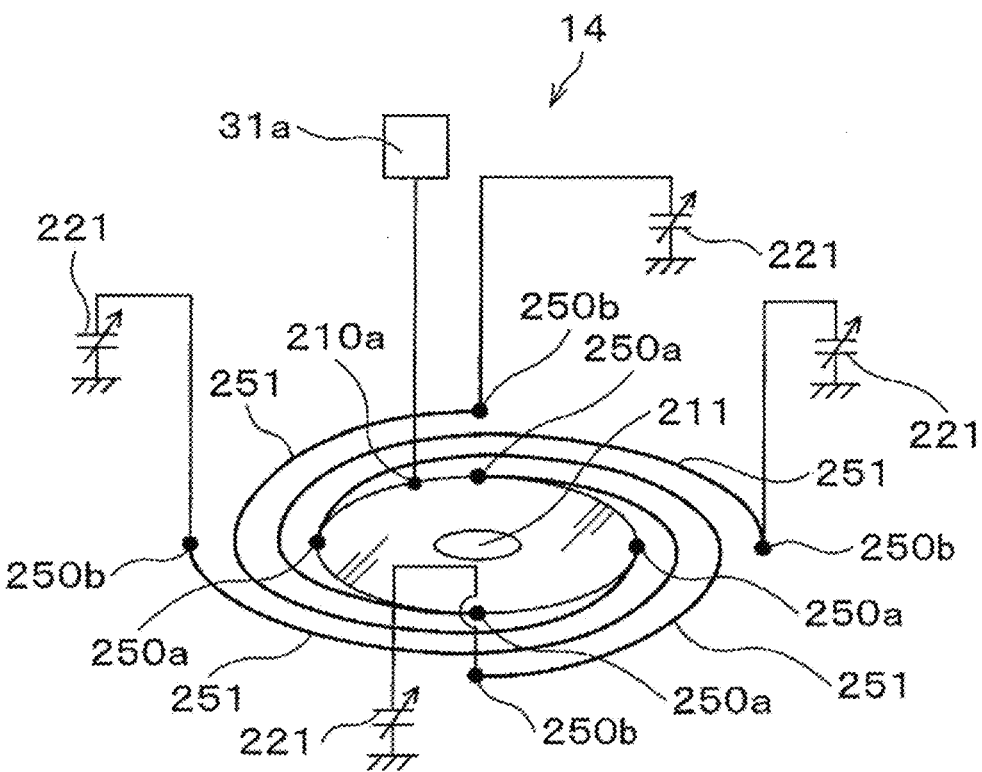
FIG. 6 is a perspective view showing the schematic configuration of the antenna unit according to the second embodiment.

Next, a configuration example of the antenna unit 14 according to a second embodiment will be described. FIG. 5 is a cross-sectional view showing a schematic configuration of the antenna unit 14. FIG. 6 is a perspective view showing the schematic configuration of the antenna unit 14.

The coil assemblies 250 are arranged at equal intervals in the circumferential direction of the conductive plate 210, and are arranged at rotationally symmetrical positions with respect to the center (of the conductive plate 210). Each of the coil assemblies 250 has a coil segment 251. The coil segment 251 is positioned on the substantially same plane as the conductive plate 210. The coil segment 251 extends in a horizontal direction or extends obliquely with respect to the horizontal direction, and is disposed at a bottom portion of the coil assembly 250. The coil segment 201 is also referred to as a plasma facing segment since it faces the plasma processing space 10*s*. Further, the coil segment 251 is connected to the outer periphery of the conductive plate 210 via a coil terminal 250*a*, and the coil terminal 250*b* is connected to the ground potential via the capacitor 221. In the illustrated example, the capacitors 221 are all variable capacitance capacitors. However, the configuration of the capacitor 221 is not limited thereto. The capacitor 221 preferable includes at least one variable capacitance capacitor, and may include a plurality of capacitors including variable capacitance capacitors and/or fixed capacitance capacitors. The impedance adjusting part may include a variable resistor and a variable inductor. Since, however, the resistor or the inductor deteriorates the efficiency of the high frequency power, it is preferable that the impedance adjusting part includes a capacitance capacitor.

Since the other configurations are the same as those of the antenna unit 14 according to the first embodiment, the operations and effects thereof are also the same. Therefore, the description thereof will be omitted.

Modifications of First and Second Embodiments

Figure 7:
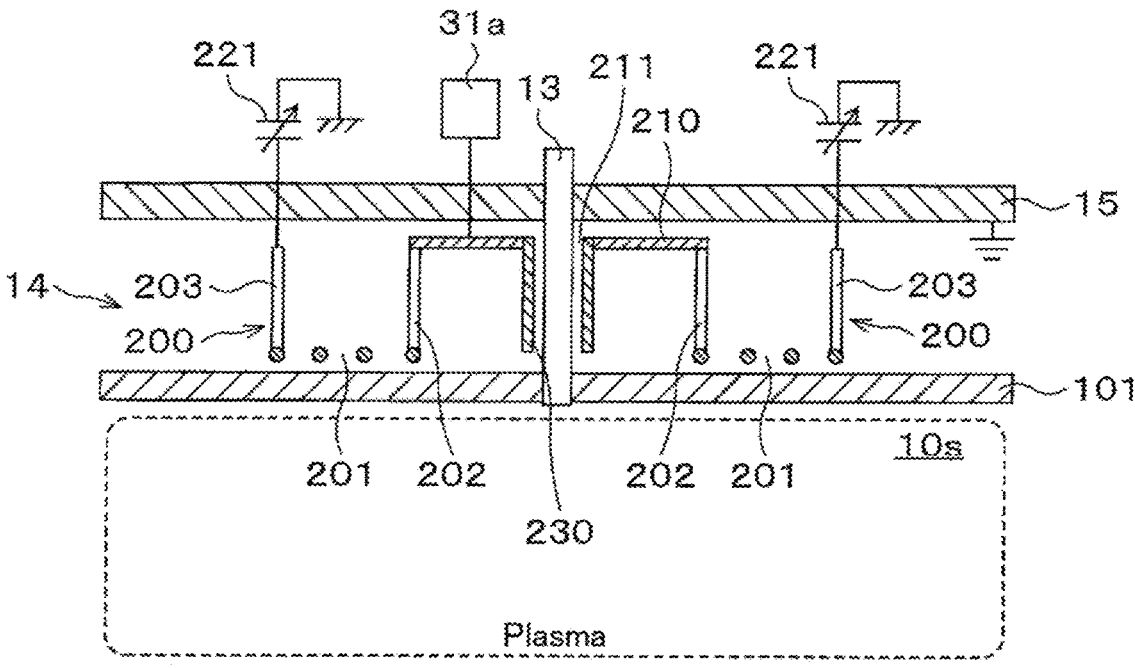
FIG. 7 is a cross-sectional view showing a schematic configuration of an antenna unit according to a modification of the first embodiment.
Figure 8:
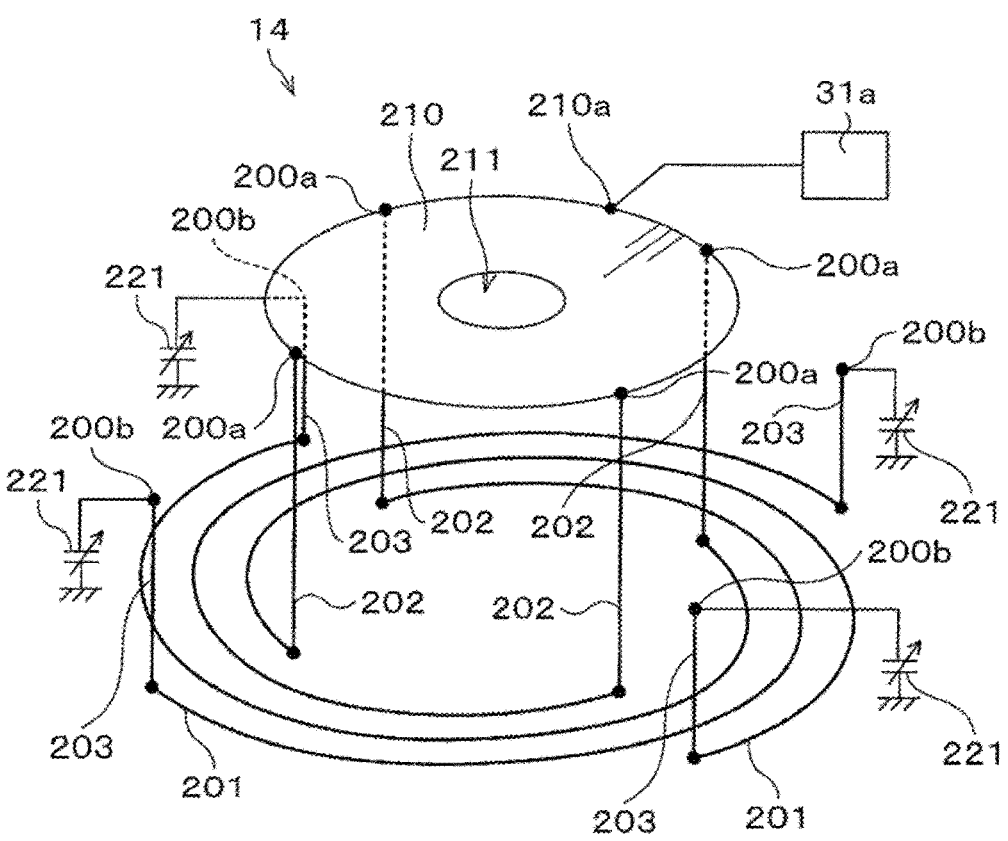
FIG. 8 is a perspective view schematically showing the schematic configuration of the antenna unit according to the modification of the first embodiment.
Figure 14:
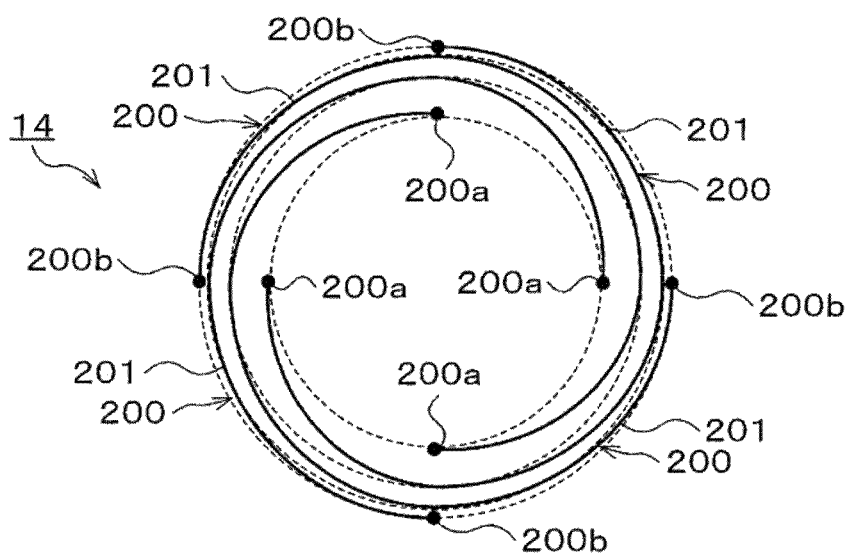
FIG. 14 is a bottom plan view showing a schematic configuration of an antenna unit according to modifications of the first and second embodiments.
Figure 15:
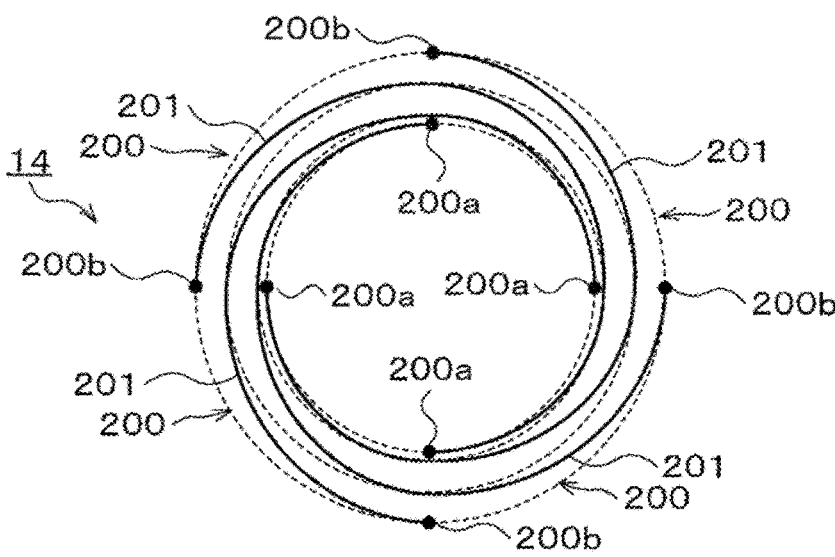
FIG. 15 is a bottom plan view showing a schematic configuration of an antenna unit according to modifications of the first and second embodiments.
Figure 16A:
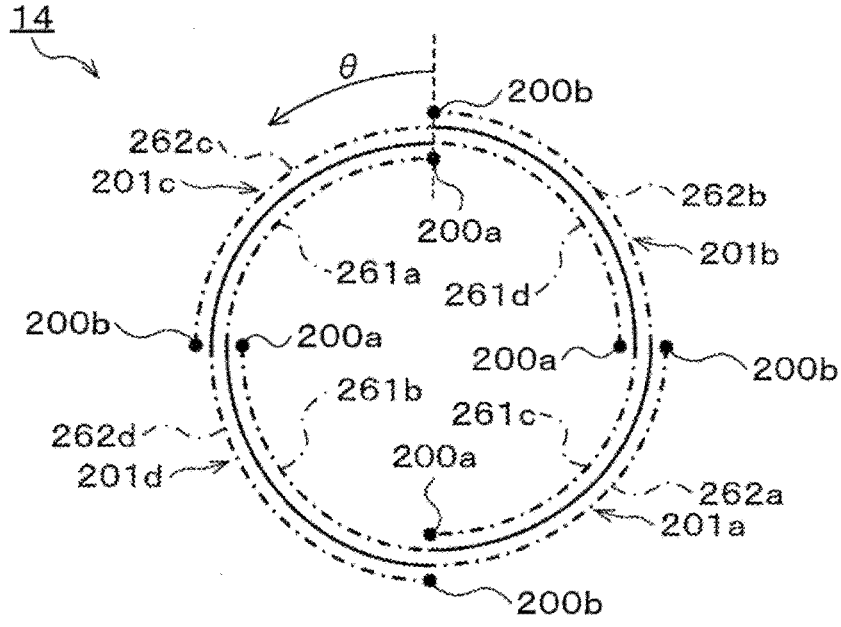
FIG. 16A is a bottom plan view showing the schematic configuration of the antenna unit according to the modifications of the first and second embodiments.
Figure 16B:
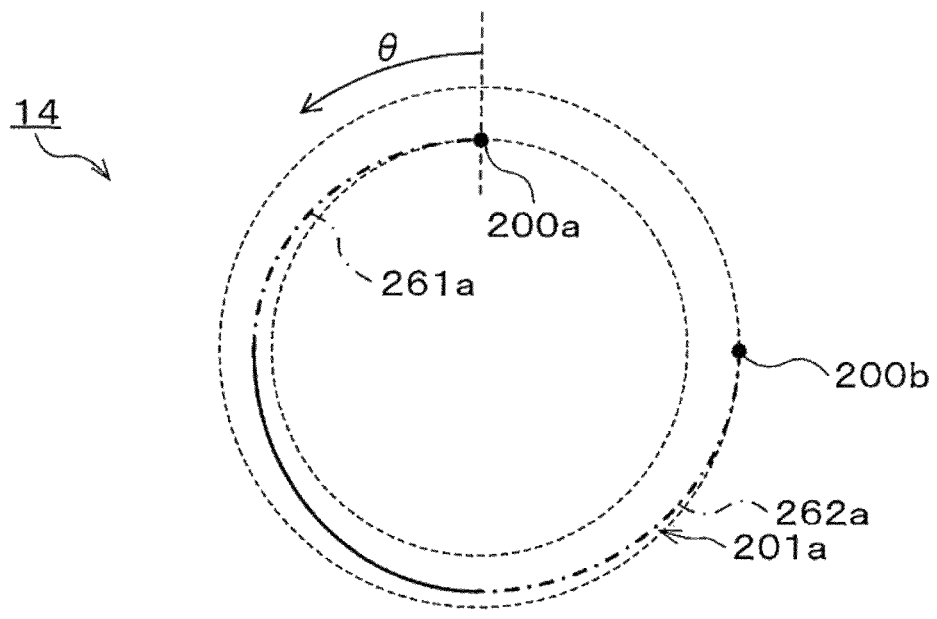
FIG. 16B is a bottom plan view showing a schematic configuration of a part of the antenna unit according to the modifications of the first and second embodiments.
Figure 16C:
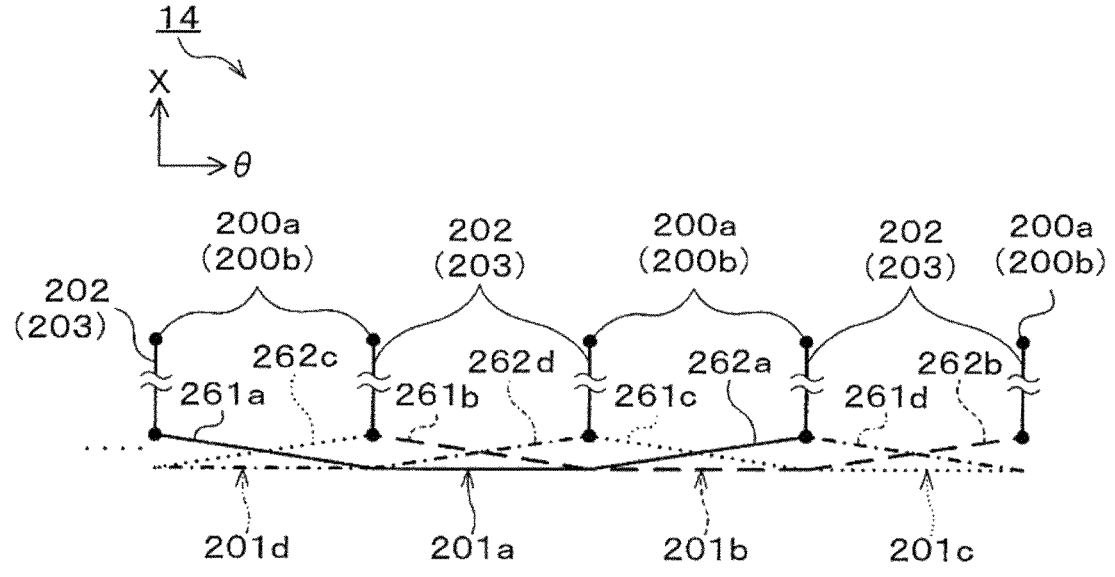
FIG. 16C shows the schematic configuration of the antenna unit according to the modifications of the first and second embodiments and illustrates side surfaces of coil assemblies viewed from an outer peripheral side in a circumferential direction.

Modifications of the configuration of the antenna unit 14 according to the first embodiment and the antenna unit 14 according to the second embodiment will be described. FIG. 7 is a cross-sectional view schematically showing an example of a modification of the configuration of the antenna unit 14. FIG. 8 is a perspective view showing the example of the modification of the configuration of the antenna unit 14. FIG. 9 to 15 are bottom plan views schematically showing the modification of the configuration of the antenna unit 14. In FIGS. 9 to 15, the illustration of the components other than the coil assembly 200 is omitted for simplicity. The coil segments 201 in the first embodiment and the coil segments 251 in the second embodiment correspond to each other and have the same arrangement. Thus, hereinafter, only the antenna unit 14 according to the first embodiment will be described. Dotted circles in FIGS. 9 to 15 indicate rotational symmetry of the coil assemblies 200 in the antenna unit 14. When n is an integer of 2 or more, there is n that allows the arrangement of the coil assemblies 200 to coincide with the original arrangement when rotated by (360/n)° around the center of the dotted circle. In the case of FIGS. 9 to 15, n is 4 and the arrangement of the coil assemblies 200 coincides with the original arrangement when rotated by 90° around the dotted circle. FIGS. 16A and 16B are bottom plan views schematically showing the modification of the configuration of the antenna unit 14. FIG. 16C illustrates the coil assemblies 200 viewed from the side surfaces in the circumferential direction. The illustration of components other than the coil assembly 200 will be omitted for simplicity. FIGS. 17 to 22 are bottom plan views and perspective views schematically showing the modification of the configuration of the antenna unit 14.

Figure 10:
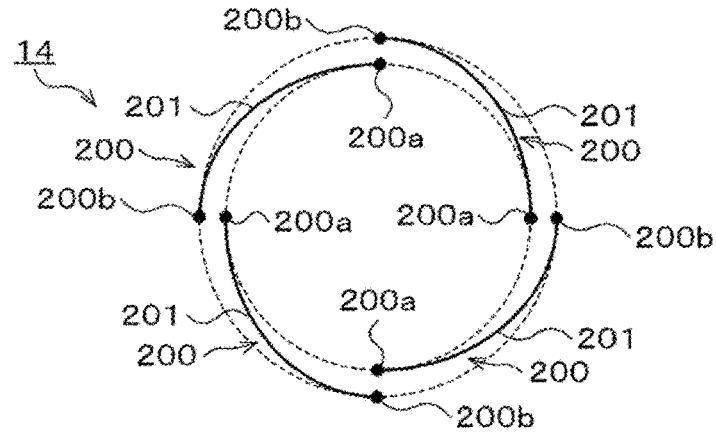
FIG. 10 is a bottom plan view showing a schematic configuration of an antenna unit according to modifications of the first and second embodiments.
Figure 11:
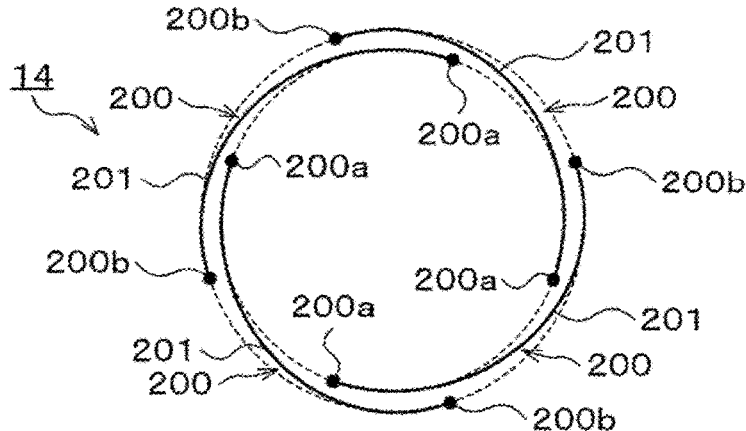
FIG. 11 is a bottom plan view showing a schematic configuration of an antenna unit according to modifications of the first and second embodiments.

In the examples of FIGS. 7 and 8, the coil segment 201 has a length of about ¾ of the length of the conductive plate 210 in the circumferential direction, whereas the coil segment 201 has a length of about ¼ of the length of the conductive plate 210 in the circumferential direction in the first embodiment. As described above, the coil segment 201 may have a desired length depending on purposes. Specifically, as shown in FIGS. 9 to 15, the coil segment 201 may have a length that is ¼ of the circumference of the dotted circle as shown in FIGS. 9 and 10, a length that is ⅜ of the circumference of the dotted circle as shown in FIG. 11, a length that is ¾ of the circumference of the dotted circle as shown in FIGS. 12, 14 and 15, and a length that is (1+¼) of the circumference of the dotted circle as shown in FIG. 13.

Figure 9:
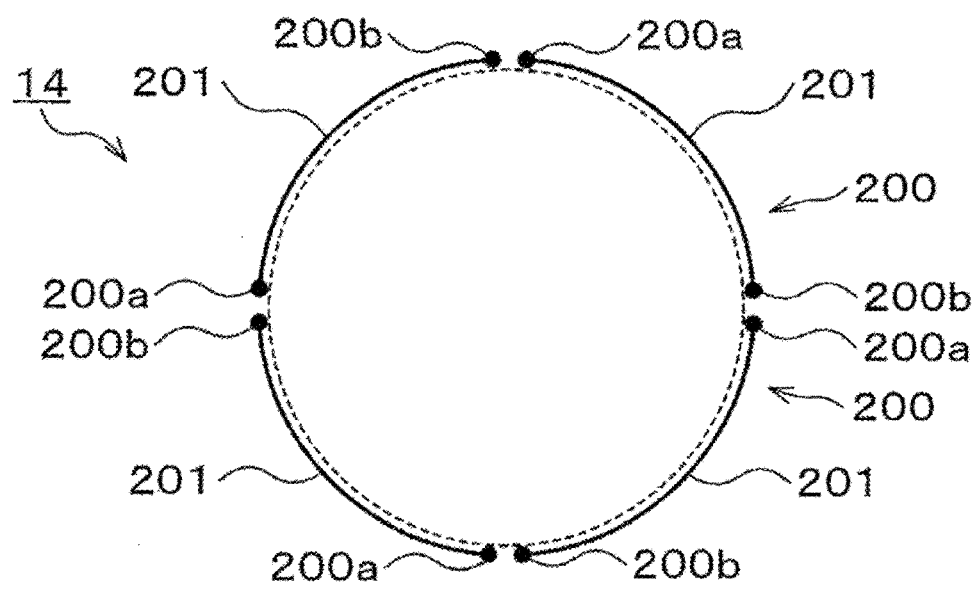
FIG. 9 is a bottom plan view showing a schematic configuration of an antenna unit according to modifications of the first and second embodiments.

The coil segments 201 may be arranged such that both ends of the coil segments 201 are positioned on the same circumference as in the example of FIG. 9. In the examples of FIGS. 10 to 15, the coil segments 201 may be arranged such that one ends thereof are positioned on the inner circumference and the other ends thereof are positioned on the outer circumference. The inner circle and the outer circle are concentric circles.

In the examples of FIGS. 11 to 15, the coil assemblies 200 are arranged such that a part of one coil assembly 200 surrounds a part of the outer peripheral side of another coil assembly 200. In other words, one end of each coil assembly 200 is surrounded by some other coil assemblies 200. Hereinafter, such arrangement in the examples of FIGS. 11 to 15 is referred to as overlap. Hereinafter, the effects of the overlap will be described. First, by arranging the plurality of coil assemblies 200 in an overlapping and rotationally symmetric manner, a plurality of sufficiently long antennas can be arranged without deteriorating the performance of the antenna. In addition, the magnetic field bias may be caused by the electric field bias at the ends of the plurality of coil assemblies 200. However, by arranging the plurality of coil assemblies 200 in an overlapping arrangement, the magnetic field generated at the ends of the coil assemblies 200 is relatively attenuated by the presence of the magnetic field generated by the coil assemblies 200 surrounding the outer sides of the ends of the coil assemblies 200. Accordingly, the uniformity of the magnetic field strength in the circumferential direction can be improved.

Figure 12:
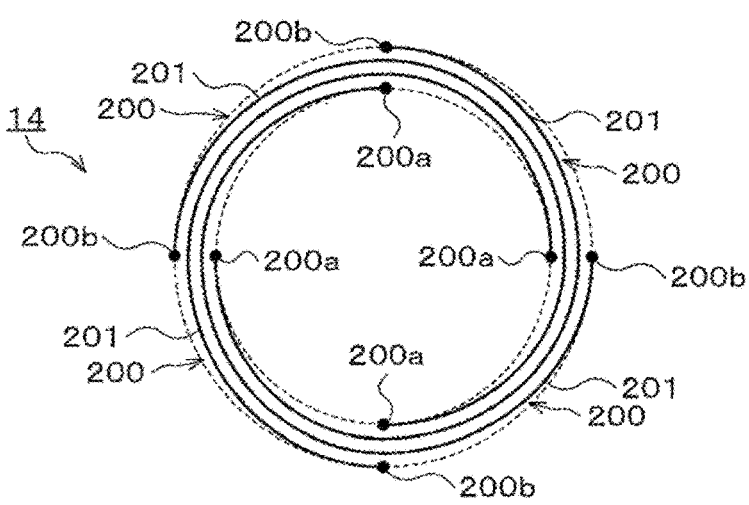
FIG. 12 is a bottom plan view showing a schematic configuration of an antenna unit according to modifications of the first and second embodiments.
Figure 13:
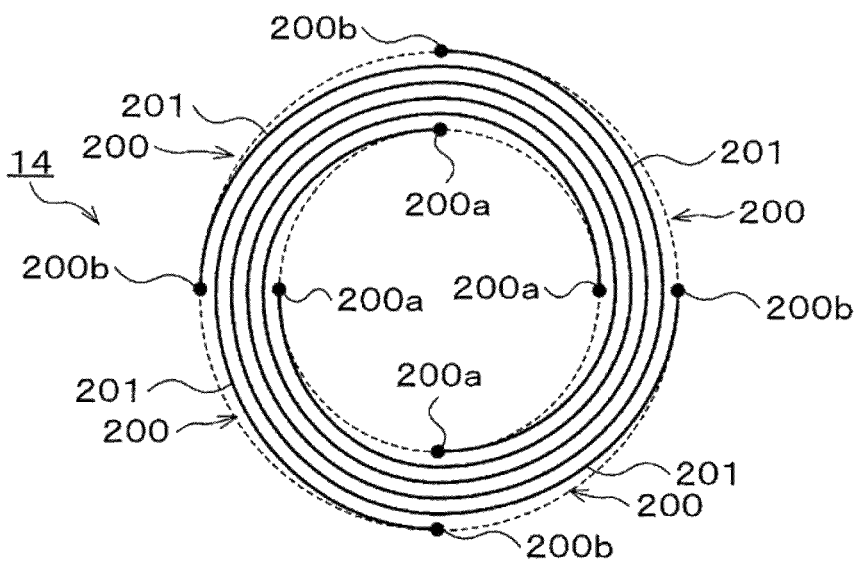
FIG. 13 a bottom plan view showing a schematic configuration of an antenna unit according to modifications of the first and second embodiments.

The curved shapes of the coil segments 201 of the coil assembly 200 shown in FIGS. 12 and 13 can be represented by Archimedean spirals in algebraic spirals. In other words, in the plurality of coil segments 201, the radial gaps between adjacent coil segments 201 are always constant. Specifically, the curves of the coil segments 201 can be represented by the polar coordinate equation $r = a\theta$, where r is a distance from the center, $\theta$ is an angle, and a is a constant.

The curved shapes of the coil segments 201 of the coil assembly 200 shown in FIG. 14 can be represented by parabolic spirals in algebraic spirals. In other words, the radial gaps between the plurality of coil segments 201 decreases toward a radially outer side. Specifically, the curves of the coil segments 201 can be represented by the polar coordinate equation $r = a\sqrt{\theta}$.

The curved shapes of the coil segments 201 of the coil assembly 200 shown in FIG. 15 can be represented by logarithmic spirals. In other words, the radial gaps between the plurality of coil segments 201 becomes increases toward the radially outer side. Specifically, the curves of the coil segments 201 can be represented by the polar coordinate equation $r = ae^{b\theta}$, where b is a constant.

As described above, by regularly arranging the coil segments 201 in the form of Archimedes spirals, parabolic spirals, or logarithmic spirals, it is possible to generate stable plasma with small deviation.

In the examples shown in FIGS. 10 to 15, the coil segments 201 rotate in a clockwise direction from one radially inner end toward the other radially outer end. However, the rotation direction of the coil segments 201 is not limited thereto, and the coil segments 201 can rotate in a counterclockwise direction.

FIGS. 16A to 16C show an example in which each of the coil segments 201a, 201b, 201c, and 201d in the four coil assemblies 200 has a length that is ¾ of the circumference of the dotted circle, similarly to the example of the antenna unit 14 according to the first embodiment shown in FIG. 10. For simplicity, the illustration of the components other than the coil assembly 200 is omitted. FIG. 16A is a bottom plan view of the coil assembly 200. In FIG. 16B, only the coil assembly 200 including the coil segment 201*a* among the four coil assemblies 200 shown in FIG. 16A is illustrated, and the illustration of the other coil assemblies 200 is omitted. In FIGS. 16A and 16B, inclined portions 261 and 262 to be described later are indicated by dash-dotted lines, and portion of the coil segment 201 except the inclined portions 261 and 262 is indicated by a solid line. FIG. 16C illustrates the schematic configuration of the four coil assemblies 200 shown in FIG. 16A, and illustrates the side surfaces of the coil assemblies 200 viewed from the outer peripheral side in the circumferential direction (θ direction) of the antenna unit 14. For simplicity, the coil segment 201*a* is indicated by a solid line; the coil segment 201*b* is indicated by a dashed line; the coil segment 201*c* is indicated by a dotted line; and the coil segment 201*d* is indicated by a dash-dotted line. In the drawing, X indicates the axial direction of the antenna unit 14, and θ indicates the circumferential direction of the antenna unit 14.

In FIGS. 16A to 16C, the coil segments 201 are disposed at the bottom portions of the coil assemblies 200. The coil segments 201 are raised at the ends connected to the vertical coil segments 202 or 203, thereby forming the inclined portions 261 and 262. The inclined portion 261 is a part of the coil segment 201 connected to the coil terminal 200*a*, and the inclined portion 262 is another part of the coil segment 201 connected to the coil terminal 200*b*. Inclined portions 261*a*, 261*b*, 261*c*, and 261*d* are parts of the coil segments 201*a*, 201*b*, 201*c*, and 201*d*, respectively. Inclined portions 262*a*, 262*b*, 262*c*, and 262*d* are other parts of the coil segments 201*a*, 201*b*, 201*c*, and 201*d*, respectively. The portions of the coil segments 201 except the inclined portions 261 and 262 may be horizontal with respect to the dielectric window 101 or may be in contact with the dielectric window 101.

Hereinafter, the effects obtained by providing the inclined portions 261 and 262 will be described. In a conventional spiral coil, the end connected to the RF generator 31*a* and the end connected to the ground potential are distant from each other, and the ends of the coil segment 201 are abruptly terminated when viewed from the plasma side. In this case, the magnetic field bias may be caused by the electric field bias. By providing the inclined portions 261 and 262 as in the example shown in FIGS. 16A to 16C, the ends of the coil segment 201 become gradually distant from the plasma side. Therefore, the influence of the magnetic field bias on the plasma generation at the ends of the coil segment 201 can be reduced, and the uniformity of the magnetic field intensity in the circumferential direction can be improved.

The inclined portions 261 and 262 occupy ⅓ of the length of the coil segment 201 as illustrated in the drawings. However, the present disclosure is not limited thereto, and the inclined portions 261 and 262 may have desired lengths depending on purposes. The angle formed by the inclined portions 261 and 262 with respect to the portion of the coil segment 201 except the inclined portions 261 and 262 may be changed to a desired angle depending on purposes.

Figure 17:
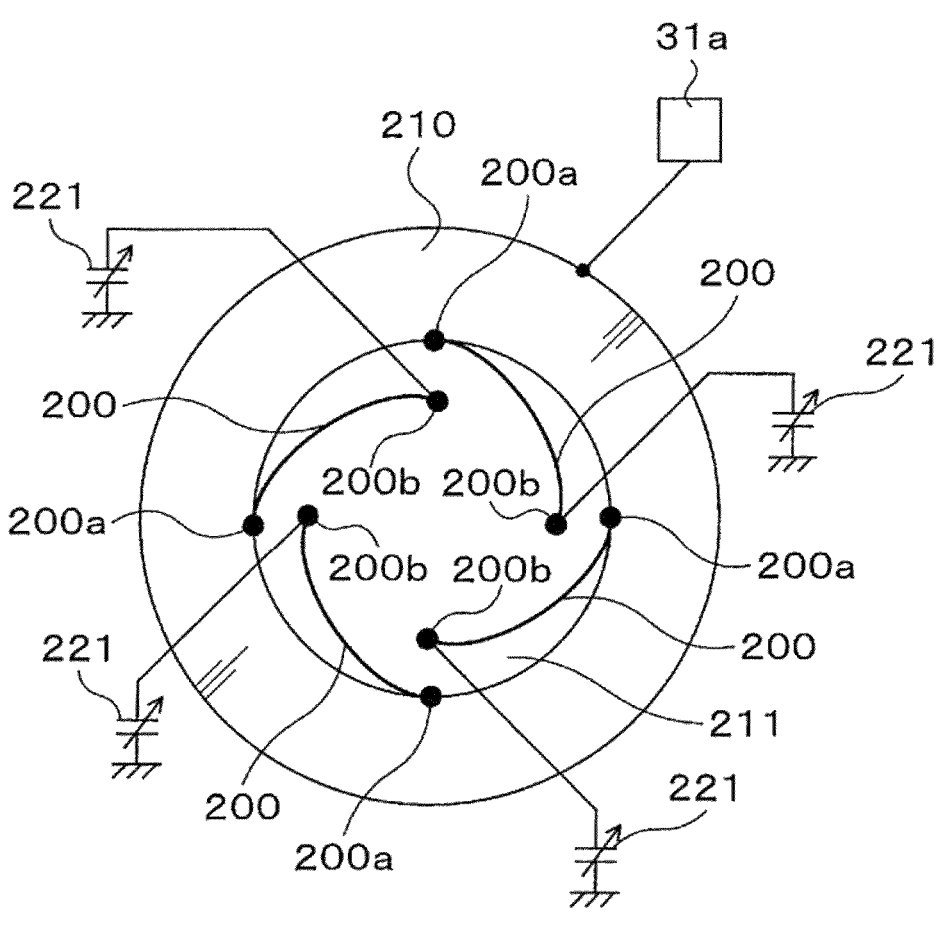
FIG. 17 is a bottom plan view showing the schematic configuration of the antenna unit according to the modification of the first embodiment.

FIG. 17 is a bottom plan view schematically showing the modification of the configuration of the antenna unit 14. FIGS. 18 to 22 are perspective views showing the modification of the configuration of the antenna unit 14. FIGS. 17, 18, and 20 to 22 show the modification of the configuration of the antenna unit 14 according to the first embodiment, and FIG. 19 shows the modification of the configuration of the antenna unit 14 according to the second embodiment.

Figure 18:
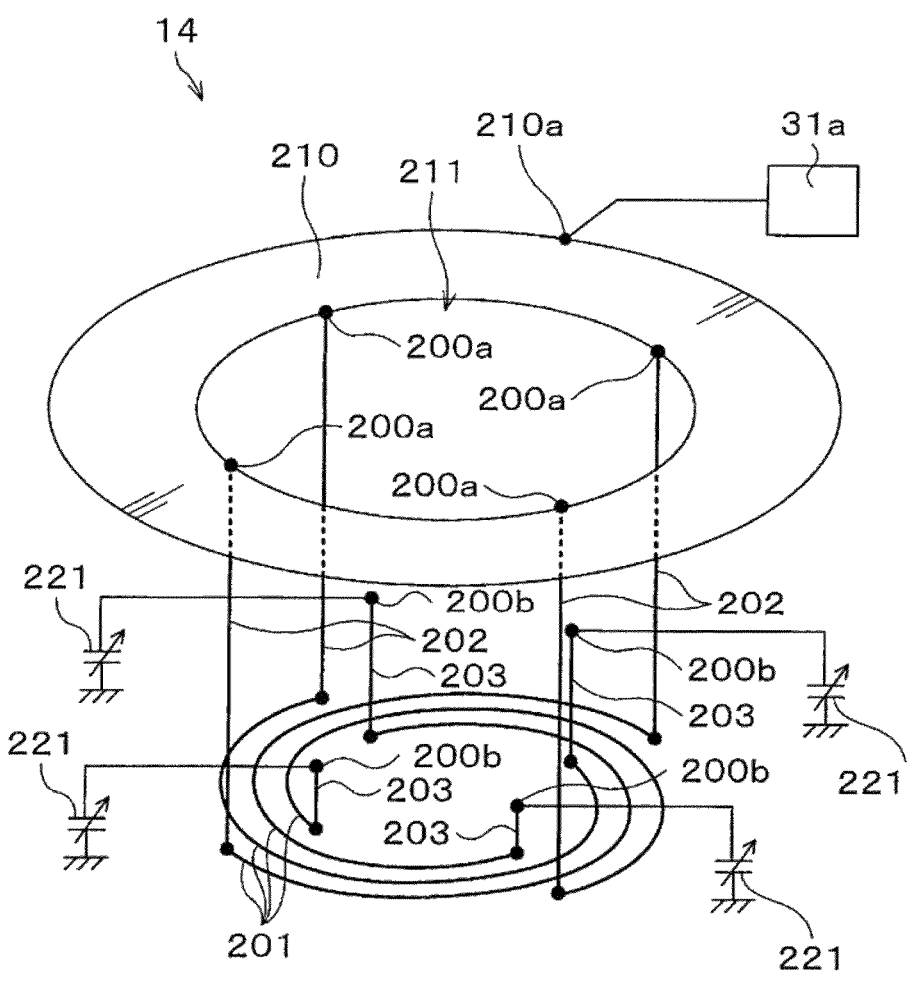
FIG. 18 is a perspective view schematically showing the schematic configuration of the antenna unit according to the modification of the first embodiment.
Figure 19:
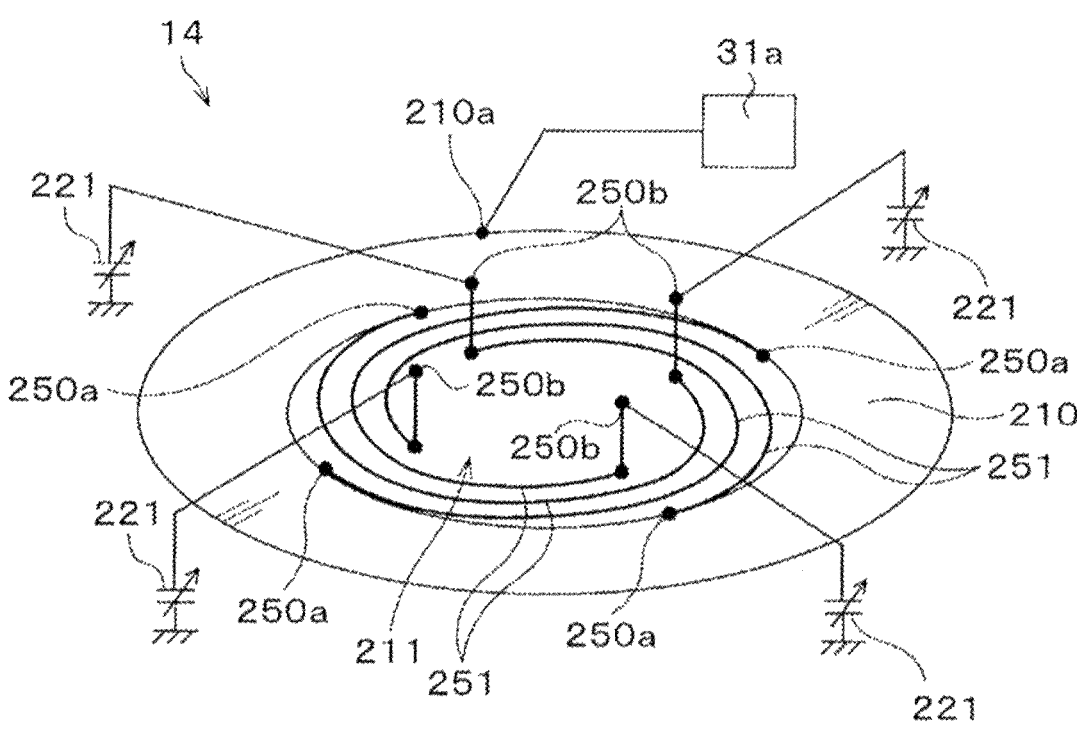
FIG. 19 is a perspective view schematically showing the schematic configuration of the antenna unit according to the modification of the second embodiment.

As shown in FIGS. 17 to 19, the plurality of coil assemblies 200 and 250 may be arranged inside the central opening 211 of the conductive plate 210. In other words, the outer diameters of the plurality of coil assemblies 200 and 250 may be the same as or smaller than the inner diameter of the central opening 211. In this case, the outer ends of the coil assemblies 200 and 250 may be connected, as the coil terminals 200*a* and 250*a*, to the inner peripheral portion of the central opening 211 in the conductive plate 210, and the inner ends of the coil assemblies 220 and 250 may be connected, as the coil terminals 200*b*, to the ground potential as the coil terminal 200*b* through the impedance adjusting part. In this specification, the inner peripheral portion of the central opening 211 refers to the peripheral portion of the conductive plate 210 that forms the central opening 211.

Figure 20:
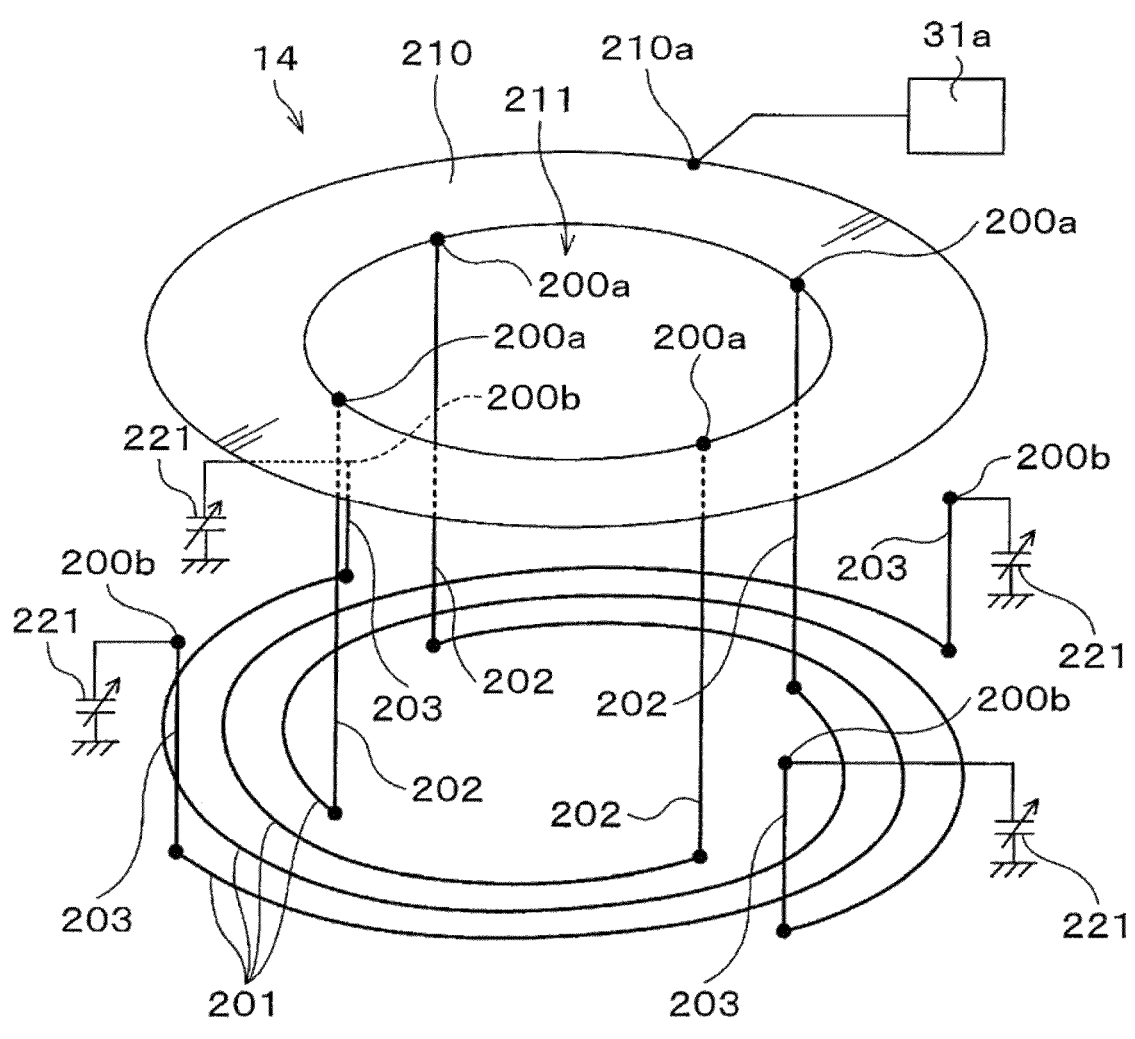
FIG. 20 is a perspective view showing the schematic configuration of the antenna unit according to the modification of the first embodiment.
Figure 21:
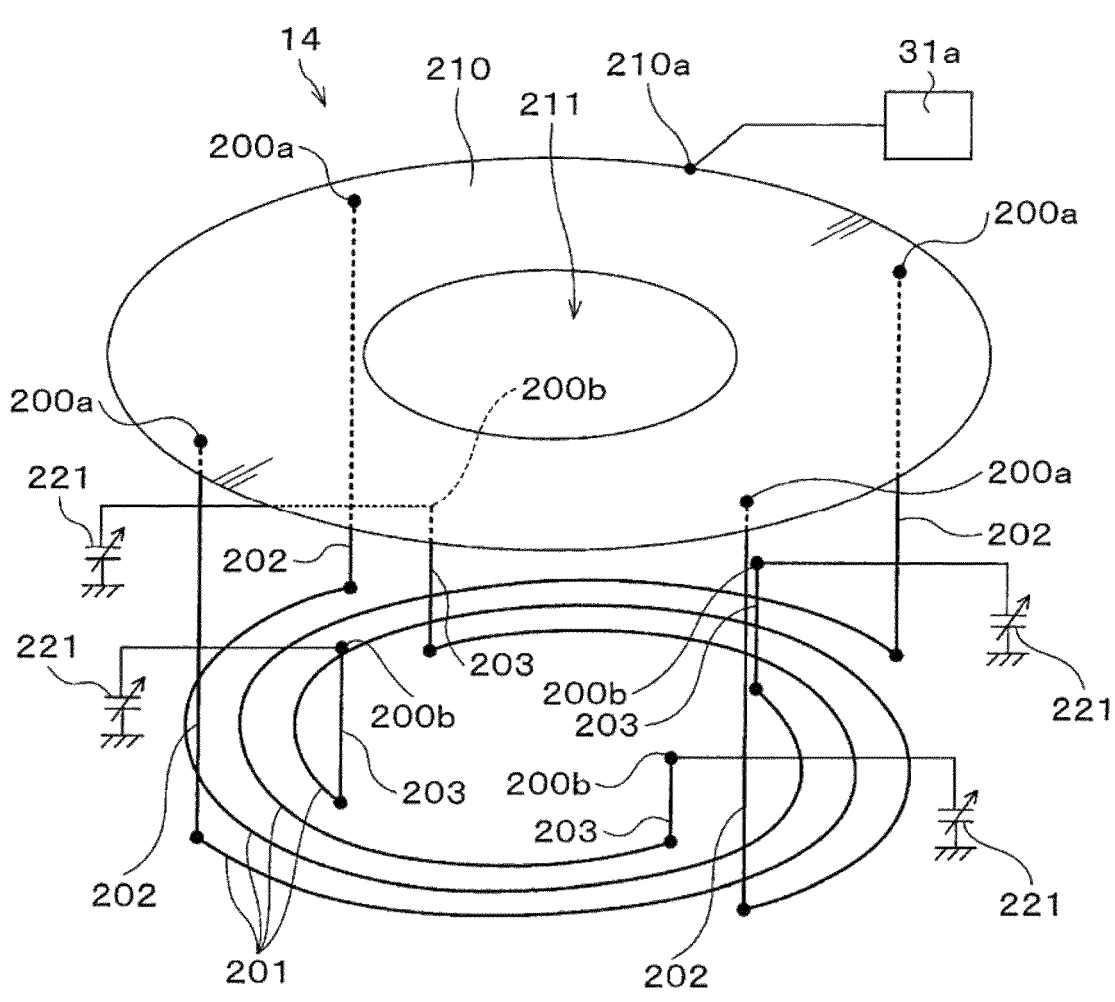
FIG. 21 is a perspective view showing the schematic configuration of the antenna unit according to the modification of the first embodiment.
Figure 22:
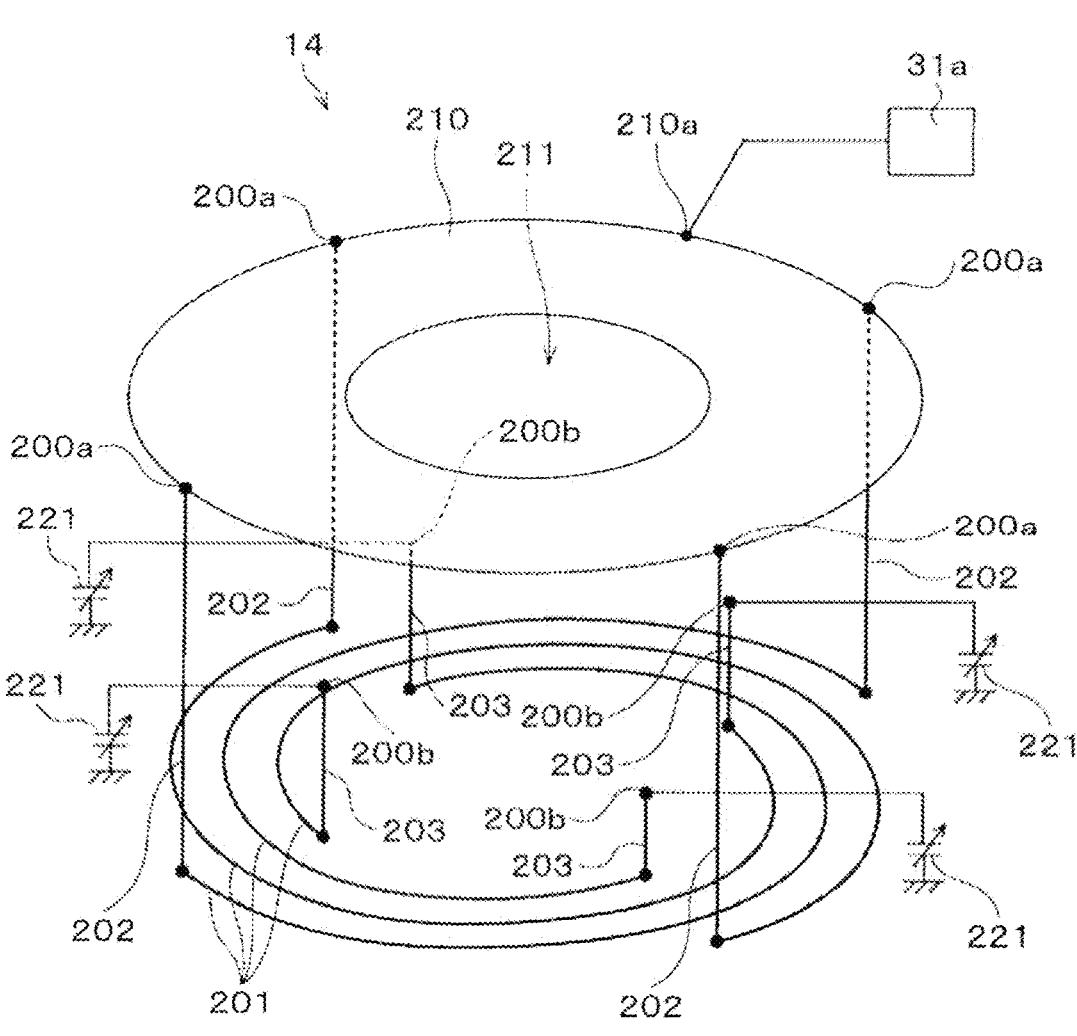
FIG. 22 is a perspective view showing the schematic configuration of the antenna unit according to the modification of the first embodiment.

As shown in FIGS. 20 to 22, the outer diameters of the plurality of coil assemblies 200 may be smaller than or equal to the outer diameter of the conductive plate 210. In other words, the plurality of coil assemblies 200 may be at least partially arranged to overlap the conductive plate 210 in plan view. In this case, as shown in FIG. 20, the inner ends of the coil assemblies 200 may be connected, as the coil terminals 200*a*, to the inner peripheral portion of the central opening 211 in the conductive plate 210, and the outer ends of the coil assemblies 200 may be connected, as the coil terminals 200*b*, to the ground potential through the impedance adjusting part. Alternatively, as shown in FIG. 21, the outer ends of the coil assemblies 200 may be connected, as the coil terminals 200*a*, onto the surface of the conductive plate 210 except the peripheral portion (outer peripheral portion or inner peripheral portion), and the inner ends of the coil assemblies 200 may be connected, as the coil terminals 200*b*, to the ground potential through the impedance adjusting part. Alternatively, as shown in FIG. 22, the outer ends of the coil assemblies 200 may be connected, as the coil terminals 200*a*, to the outer peripheral portion of the conductive plate 210, and the inner ends of the coil assemblies 200 may be connected, as the coil terminals 200*b*, to the ground potential through the impedance adjusting part.

Third Embodiment

Figure 23:
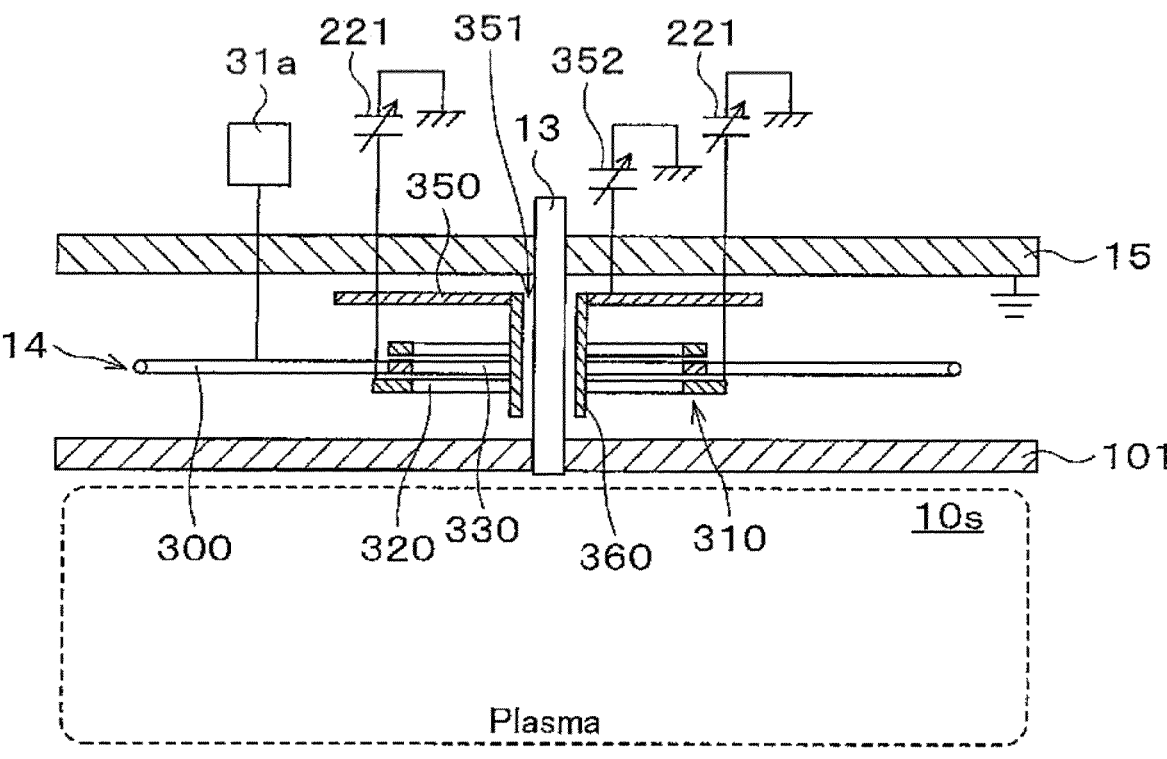
FIG. 23 is a cross-sectional view showing a schematic configuration of an antenna unit according to a third embodiment.
Figure 24:
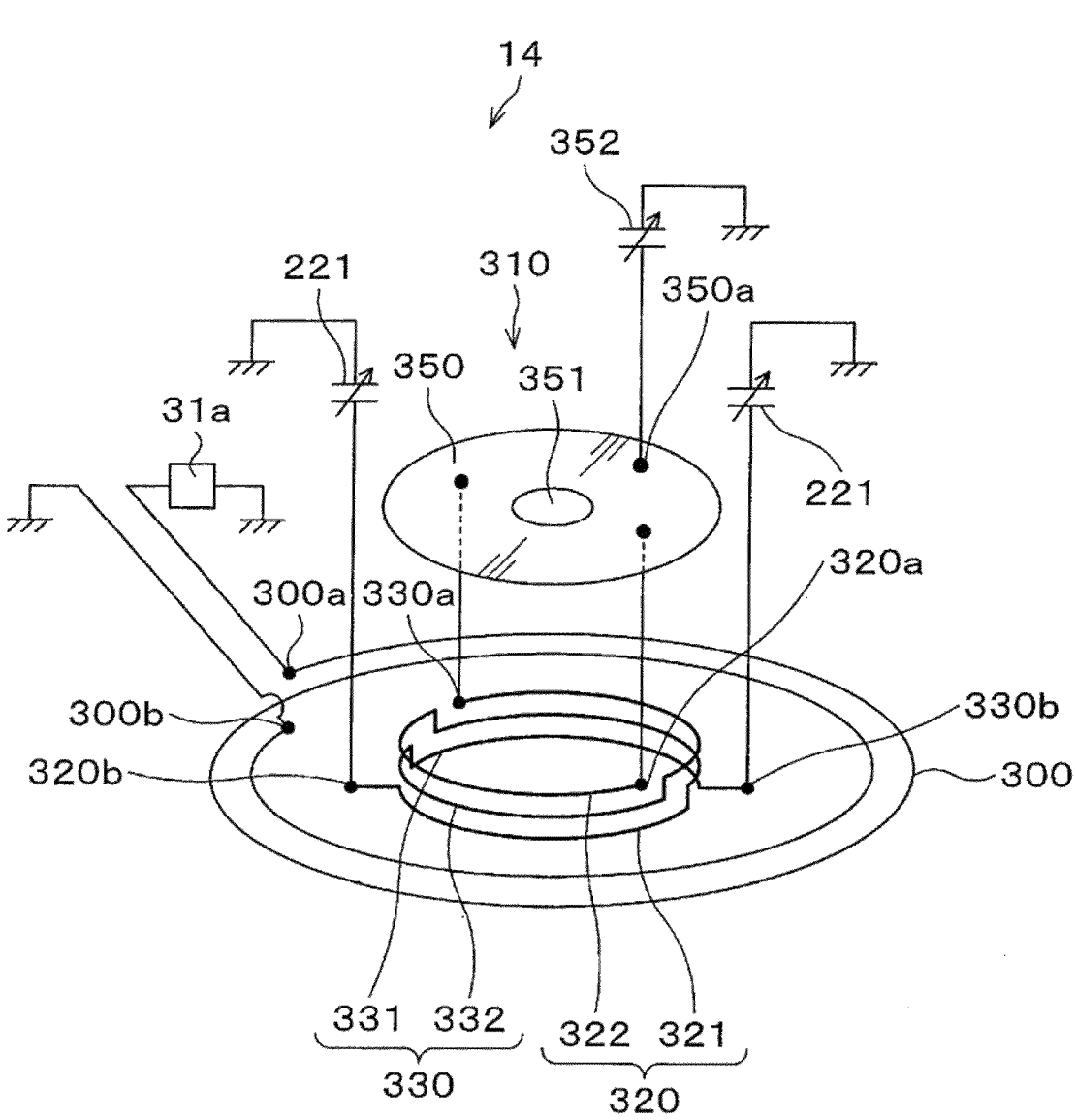
FIG. 24 is a perspective view schematically showing the schematic configuration of the antenna unit according to the third embodiment.

Next, a configuration example of the antenna unit 14 according to a third embodiment will be described. FIG. 23 is a cross-sectional view showing a schematic configuration of the antenna unit 14. FIG. 24 is a perspective view showing the schematic configuration of the antenna unit 14.

The antenna unit 14 includes at least one antenna. In one embodiment, the antenna unit 14 includes a main antenna and a sub-antenna 310. The main antenna includes at least one main coil. In the examples of FIGS. 23 and 24, the main antenna includes one main coil 300. The main coil 300 and the sub-antenna 310 are arranged above the dielectric window 101. The sub-antenna 310 is not necessarily separated from the dielectric window 101. For example, the sub-antenna 310 may be in contact with an upper surface of the dielectric window 101.

The sub-antenna 310 is disposed around the substantially cylindrical central gas injector 13 to surround the central gas injector 13, and is disposed at a radially inner side of the main coil 300. In other words, the sub-antenna 310 is disposed between the central gas injector 13 and the main coil 300. The main coil 300 is disposed around the central gas injector 13 and the main coil 300 to surround the central gas injector 13 and the main coil 300. Each of the main coil 300 and the sub-antenna 310 has a substantially circular outer shape in plan view. The main coil 300 and the sub-antenna 310 are arranged such that the outer shapes thereof form concentric circles.

The main coil 300 is formed in a substantially circular spiral shape, and is disposed such that the central axis of the outer shape of the main coil 300 coincides with the vertical axis. Further, the main coil 300 is a planar coil extending in the horizontal direction or extending obliquely with respect to the horizontal direction. A power feed terminal 300*a* is disposed at one end of the main coil 300. The power feed terminal 300*a* is connected to the first RF generator 31*a* of the power supply 30, i.e. to the RF potential. A ground terminal 300*b* is disposed at the other end of the main coil 300. The ground terminal 300*b* is connected to ground, i.e., to the ground potential. The main coil 300 is configured to resonate at a half of a wavelength λ of an RF power supplied from the first RD generator 31*a*. A voltage generated at the line constituting the main coil 300 is distributed such that it becomes minimum at both ends of the line and becomes maximum near the midpoint of the line. Further, a current generated at the line constituting the main coil 300 is distributed such that it becomes maximum near the midpoint of the line and becomes minimum at both ends of the line. A frequency and power of the first RF generator 31*a* for supplying an RF power to the main coil 300 are variable.

Figure 25:
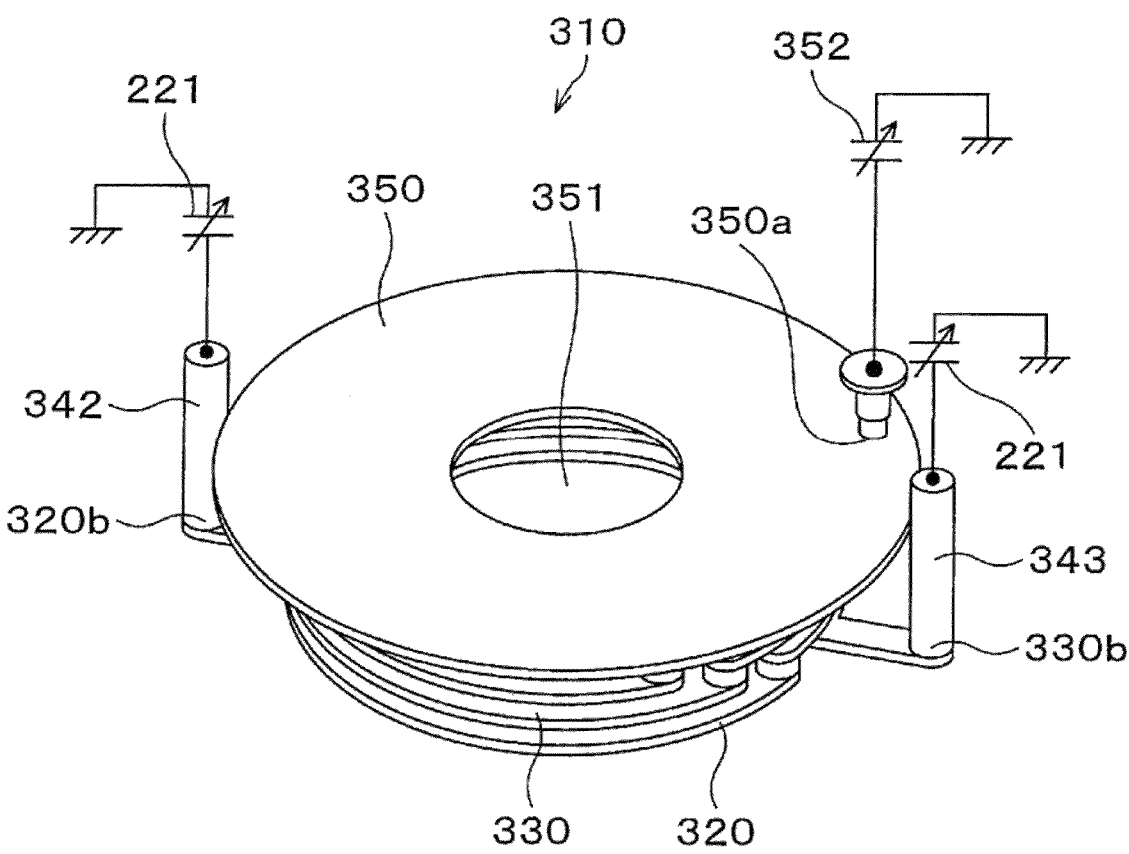
FIG. 25 is a top perspective view showing a schematic configuration of a sub-antenna according to the third embodiment.
Figure 26:
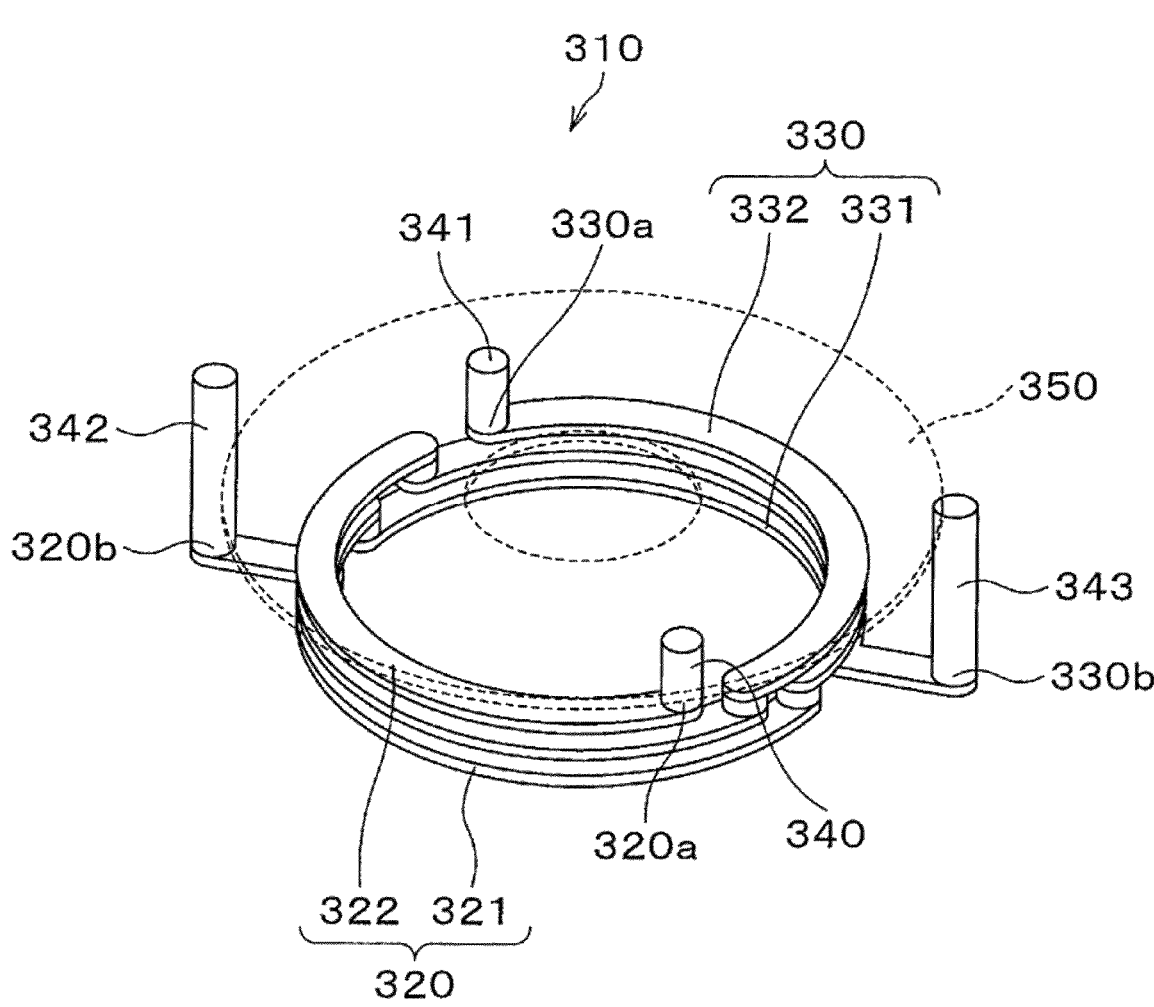
FIG. 26 is a top perspective view showing a schematic configuration of a sub-antenna according to the third embodiment.
Figure 27:
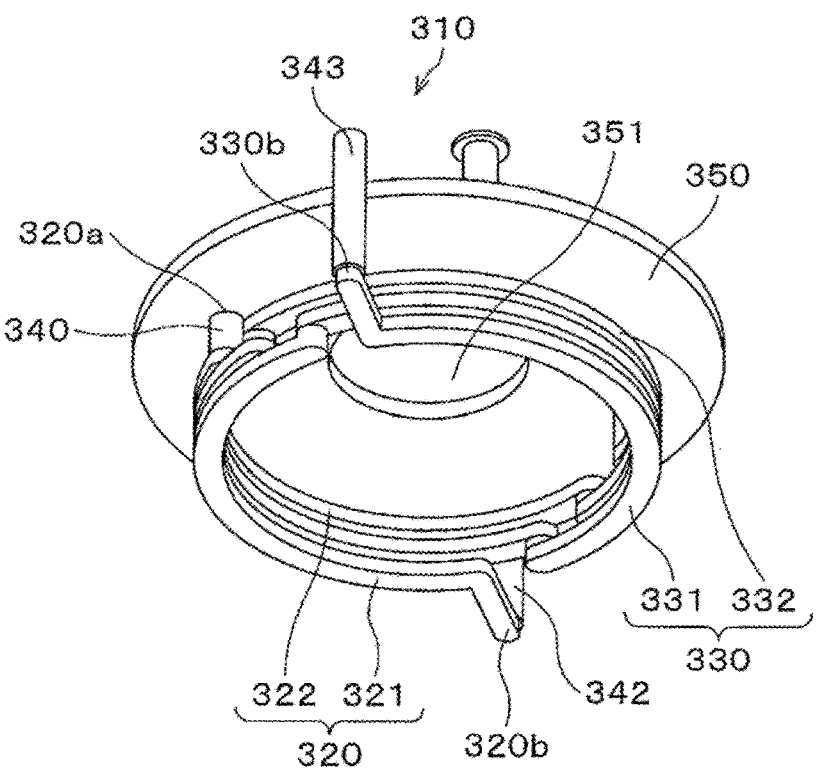
FIG. 27 is a bottom perspective showing the schematic configuration of the sub-antenna according to the third embodiment.

FIGS. 25 and 26 are top perspective views showing a schematic configuration of the sub-antenna 310. FIG. 27 is a bottom perspective view showing the schematic configuration of the sub-antenna 310.

The sub-antenna 310 has a first coil assembly 320, a second coil assembly 330, connecting members 340 to 343, a conductive plate 350, and a conductive cylindrical portion 360.

Each of the first coil assembly 320 and the second coil assembly 330 has a spiral structure. The first coil assembly 320 has one or more turns and the second coil assembly 330 has one or more turns. Each turn of the first coil assembly 320 and each turn of the second coil assembly 330 are arranged alternately in the vertical direction when viewed from the side. The central axis of the outer shape of the first coil assembly 320 and the central axis of the outer shape of the second coil assembly 330 coincide with the vertical axis, and the first coil assembly 320 and the second coil assembly 330 are arranged coaxially. The first coil assembly 320 and the second coil assembly 330 are formed in a substantially circular shape in plan view. Further, the diameters of the turns of the first coil assembly 320 are the same, and the diameters of the turns of the second coil assembly 330 are the same. As described above, the sub-antenna 310 has a substantially cylindrical double helical structure.

In the illustrated example, the number of turns (the number of windings) of the first coil assembly 320 and the second coil assembly 330 is 1.5. However, the number of turns thereof is not limited thereto, and may be set to any number of turns of 1 or more. For example, the number of turns of the first coil assembly 320 and the second coil assembly 330 may be two or more.

The first coil assembly 320 has a first coil segment 321 and a first spiral coil segment 322. The first coil segment 321 extends in the horizontal direction or extends obliquely with respect to the horizontal direction, and is disposed at a bottom portion of the first coil assembly 320. The first spiral coil segment 322 is disposed in a spiral shape in the vertical direction from the first coil segment 321. A first upper coil terminal 320*a* is disposed at an upper end of the first coil assembly 320 (the end of the first spiral coil segment 322), and a first lower coil terminal 320*b* is disposed at a lower end of the first coil assembly 320 (the end of the first coil segment 321).

The second coil assembly 330 has a second coil segment 331 and a second spiral coil segment 332. The second coil segment 331 extends in the horizontal direction or extends obliquely with respect to the horizontal direction, and is disposed at a bottom portion of the second coil assembly 330. The second spiral coil segment 332 is disposed in a spiral shape in the vertical direction from the second coil segment 331. A second upper coil terminal 330*a* is disposed at an upper end of the second coil assembly 330 (the end of the second spiral coil segment 332), and a second lower coil terminal 330*b* is disposed at a lower end of the first coil assembly 320 (the end of the first coil segment 321).

The first upper coil terminal 320*a* and the second upper coil terminal 330*a* are arranged at symmetrical positions with respect to the center of the sub-antenna 310, i.e., at positions where the central angle formed by the adjacent upper coil terminals is about 180 degrees. Further, the first upper coil terminal 320*a* and the second upper coil terminal 330*a* are axially symmetric with respect to a plate terminal 350*a* to be described later. In other words, the distance between the first upper coil terminal 320*a* and the plate terminal 350*a* is the same as the distance between the second upper coil terminal 330*a* and the plate terminal 350*a*. The first lower coil terminal 320*b* and the second lower coil terminal 330*b* are also arranged at symmetrical positions with respect to the center of the sub-antenna 310, i.e., at positions where the central angle formed by the adjacent lower coil terminals is about 180 degrees.

The first upper coil terminal 320*a* is connected to a bottom surface of the conductive plate 350 through the connecting member 340. The second upper coil terminal 330*a* is connected to the bottom surface of the conductive plate 350 through the connecting member 341. The first upper coil terminal 320*a* and the second upper coil terminal 330*a* may be connected to an upper surface of the conductive plate 350.

The first lower coil terminal 320*b* is connected to the ground potential through the connecting member 342 and the impedance adjusting part. The second lower coil terminal 330*b* is connected to the ground potential through the connecting member 343 and the impedance adjusting part. As described above, the sub-antenna 310 is not connected to the power supply 30, so that an RF power is not directly supplied to the sub-antenna 310.

The arrangement of the first upper coil terminal 320*a* and the second upper coil terminal 330*a* and the arrangement of the first lower coil terminal 320*b* and the second lower coil terminal 330*b* in plan view are not particularly limited. Since, however, a voltage difference between the first and second upper coil terminals 320*a* and 330*a* and the first and second lower coil terminals 320*b* and 330*b* is large, it is practically preferable to maintain a certain gap.

The conductive plate 350 is disposed above the first coil assembly 320 and the second coil assembly 330. In other words, the conductive plate 350 is separated from the plasma processing space 10*s* where plasma is generated, and is disposed near the conductor plate 15. Further, the conductive plate 350 is disposed around the substantially cylindrical central gas injector 13 to surround the central gas injector 13. The conductive plate 350 has a substantially circular shape in plan view, and has a central opening 351. The shape of the conductive plate 350 is not particularly limited, and may be, e.g., a polygonal shape. Preferably, the conductive plate 210 has a rotationally symmetrical shape. When the conductive plate 210 has a polygonal shape, the number of vertices is preferably an integer multiple of the number of coil assemblies 200. The central gas injector 13 is inserted into the central opening 351. The plate terminal 350a is disposed on the upper surface of the conductive plate 350. The plate terminal 350a may be disposed on the bottom surface of the conductive plate 350. The plate terminal 350a is connected to the ground, i.e., to the ground potential, through the capacitor 352. The plate terminal 350a may be directly connected to the ground potential, or may be connected to the ground potential through another electric element such as a coil or the like. In other words, the plate terminal 350a is directly or indirectly connected to the ground potential. The capacitor 352 includes a variable capacitance capacitor. The capacitor 352 is not limited to that of the second embodiment, and may be a capacitor having a fixed capacitance, or may include a plurality of capacitors including a variable capacitance capacitor and/or a fixed capacitance capacitor. The impedance adjusting part may include a variable resistor and a variable inductor. Since, however, the resistor or the inductor deteriorates the efficiency of the high frequency power, it is preferable that the impedance adjusting part includes a capacitance capacitor. In the above embodiment, the plate terminal 350a and the lower coil terminals 320b and 330b are connected to the ground potential through the capacitor 352. On the other hand, the plate terminal 350a and the lower coil terminals 320b and 330b may be connected to the ground potential through another conductive plate. In that case as well, the same effect as that of the above embodiment can be obtained.

The conductive cylindrical portion 360 has the same configuration as the conductive cylindrical portion 230 of the first embodiment. In other words, the conductive cylindrical portion 360 is disposed around the central gas injector 13 to surround the central gas injector 13 inside the central opening 351. The conductive cylindrical portion 360 extends downward from the central opening 351 to a position on or above the dielectric window 101. The conductive cylindrical portion 360 may be connected to the conductive plate 350, or may be separately provided without being connected to the conductive plate 350.

The sub-antenna 310 is inductively coupled to the main coil 300, and a current flows through the sub-antenna 310 in a direction that cancels the magnetic field generated by the current flowing through the main coil 300. By controlling the capacitance of the capacitor 352, it is possible to control the direction or magnitude of the current flowing through the sub-antenna 310 with respect to the current flowing through the main coil 300.

Action of Antenna

In the antenna unit 14 configured as described above, a magnetic field is generated in the vertical axis direction by the current flowing through the main coil 300 and the current flowing through the sub-antenna 310, and an induced electric field is generated in the plasma processing chamber 10 by the generated magnetic field. Due to the induced electric field generated in the plasma processing chamber 10, plasma is produced from the processing gas supplied from the central gas injector 13 into the plasma processing chamber 10. Then, plasma processing such as etching, film formation, or the like is performed on the substrate W on the central region ilia by ions or active species in the plasma.

Effect of Antenna

Here, in a comparative example, when the configuration of the sub-antenna 310 does not include the conductive plate

350 and the connecting members 340 and 341 are connected to each other and connected to the ground through the capacitor 352, the same problem as that of the conventional antenna is caused. In other words, in the comparative example, the ratio of the current distribution to the first coil assembly 320 and the second coil assembly 330 is biased. As a result, the circumferential uniformity of the magnetic field strength deteriorates. On the other hand, in the antenna unit 14 of the second embodiment, the plate-shaped conductive plate 350 serves as a current branching portion, so that the induction coupling does not occur, and there is no bias in the ratio of the current distribution to the first coil assembly 320 and the second coil assembly 330. Hence, the circumferential uniformity of the magnetic field strength can be improved.

Further, in the comparative example, the magnetic force lines freely pass between the first coil assembly 320 and the second coil assembly 330, so that a dielectric electromotive force is generated and the magnetic field generation efficiency deteriorates. On the other hand, in the antenna unit 14 of the second embodiment, the plate-shaped conductive plate 350 does not allow the magnetic force lines to pass therethrough, so that it is possible to suppress the inflow of extra magnetic force lines. As a result, the magnetic field generation efficiency can be improved in the second embodiment, although the magnetic field generation efficiency can be improved compared to the comparative example, the effect of improving the magnetic field generation efficiency may be small due to the presence of the central opening 351 of the conductive plate 350. Therefore, the effect of improving the magnetic field generation efficiency can be enhanced by providing a slit 370 in the conductive plate 350 as in a modification to be described later.

The first lower coil terminal 320b and the second lower coil terminal 330b are connected to the ground potential through the capacitor 221. At least one of the capacitors 221 is a variable capacitance capacitor. Therefore, when the current distribution ratio is biased, it is possible to further suppress the current distribution ratio bias by controlling the impedance by changing the capacitance of one or multiple capacitors 221. The impedance in the sub-antenna 310 may be adjusted by providing a desired impedance adjusting part in addition to the capacitor 221.

Modification of Third Embodiment

Figure 28:
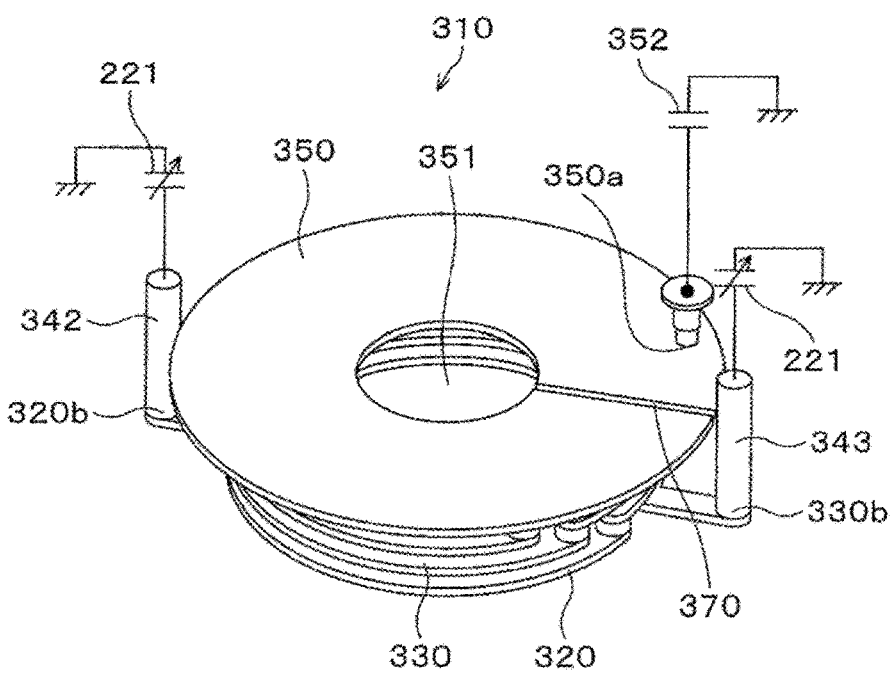
FIG. 28 is a top perspective view showing a schematic configuration of a sub-antenna according to a modification of the third embodiment.

As shown in FIG. 28, in the sub-antenna 310 of the second embodiment, the conductive plate 350 may have the slit 370 extending radially from the central opening 211 to an outer end portion (outer edge) of the conductive plate 350. The slit 370 is formed to separate the conductive plate 350, and the current in the conductive plate 350 is changed by the slit 370 as will be described later.

The present inventors have studied and found that the circumferential uniformity of the magnetic field strength is slightly lower when the slit 370 is formed than when the slit 370 is not formed, whereas the magnetic field generation efficiency can be improved. They also have found that the circumferential uniformity of the magnetic field strength and the generation efficiency of the magnetic field vary depending on the position of the slit 370 in the conductive plate 350.

Referring to FIGS. 29 to 32, the variation in the circumferential uniformity of the magnetic field strength and the magnetic field generation efficiency will be described. FIGS. 29 to 32 explain the currents depending on the existence/non-existence of the slit 370 and the position of the slit 370 in the conductive plate 350. Hereinafter, the circumferential uniformity of the magnetic field strength will be referred to as bias B. The bias B indicates a ratio of a difference between a maximum value and a minimum value with respect to an average value of the magnetic field in the magnetic field distribution of one round (360 degrees). Further, the magnetic field generation efficiency will be referred to as efficiency E. The efficiency E indicates the strength of the magnetic field generated in the plasma by the sub-antenna 310 per unit length.

Pattern 1

Figure 29:
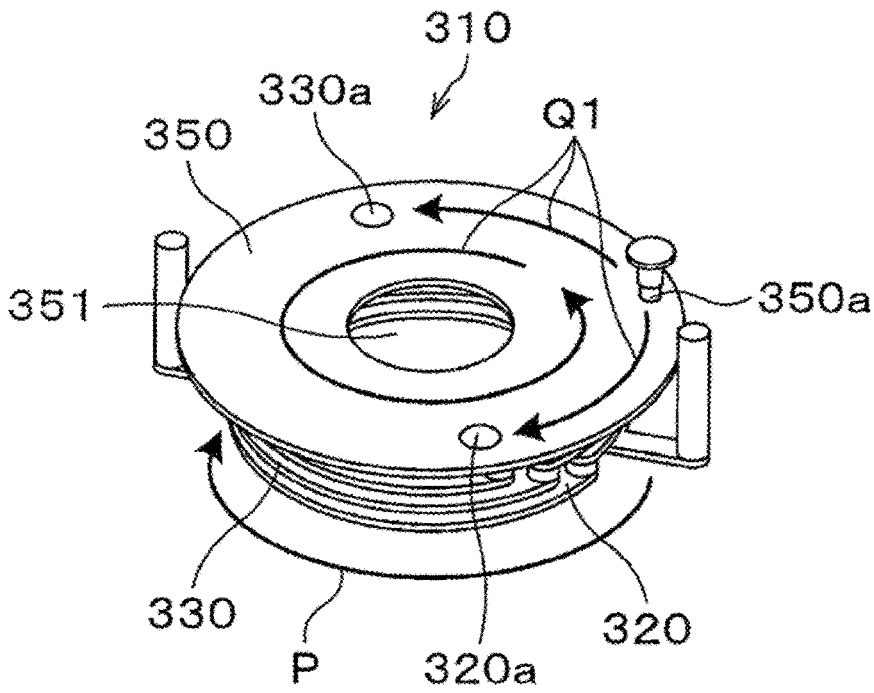
FIG. 29 explains a current flowing through a conductive plate in the third embodiment.

In a pattern 1, the slit 370 is not formed in the conductive plate 350 as shown in FIG. 29. In the pattern 1, induced currents Q1 flow through the conductive plate 350 with respect to a current P flowing through the first coil assembly 320 and the second coil assembly 330. In that case, the bias B1 can be suppressed. Since, however, the induced currents Q1 is cancelled out with respect to the current P, the efficiency E1 decreases.

Pattern 2

Figure 30:
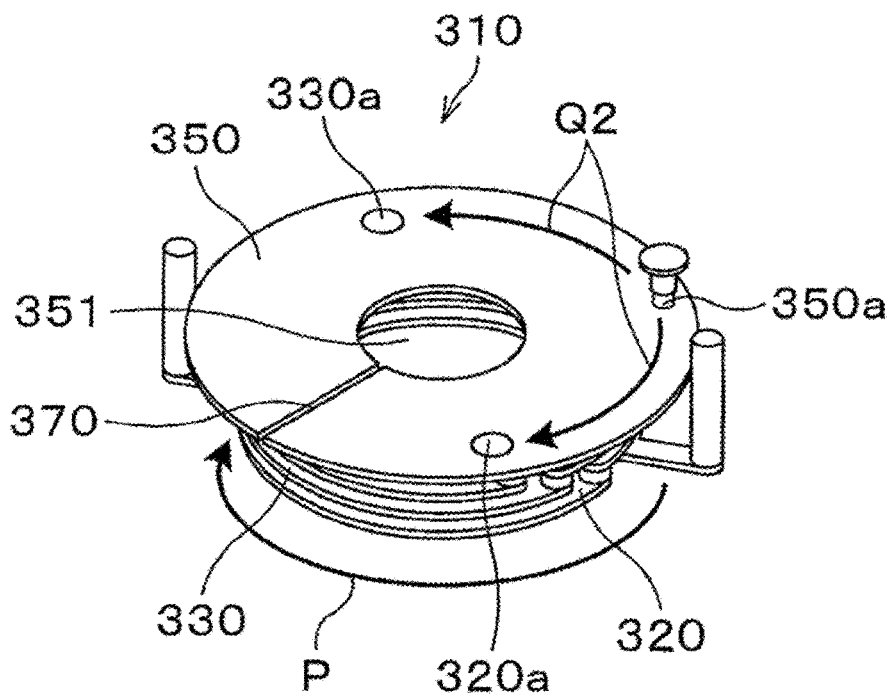
FIG. 30 explains a current flowing through a conductive plate in the third embodiment.

In a pattern 2, as shown in FIG. 30, in plan view, the slit 370 is formed between the first upper coil terminal 320a and the second upper coil terminal 330a, and is formed on the opposite side of the plate terminal 350a. In that case, since the slit 370 is formed, induced currents Q2 do not go around the conductive plate 350 and becomes smaller than the induced currents Q1 of the pattern 1. Therefore, the efficiency E2 of the pattern 2 becomes higher than the efficiency E1 of the pattern 1. However, the bias B2 of the pattern 2 becomes greater than the bias B1 of the pattern 1.

Pattern 3

Figure 31:
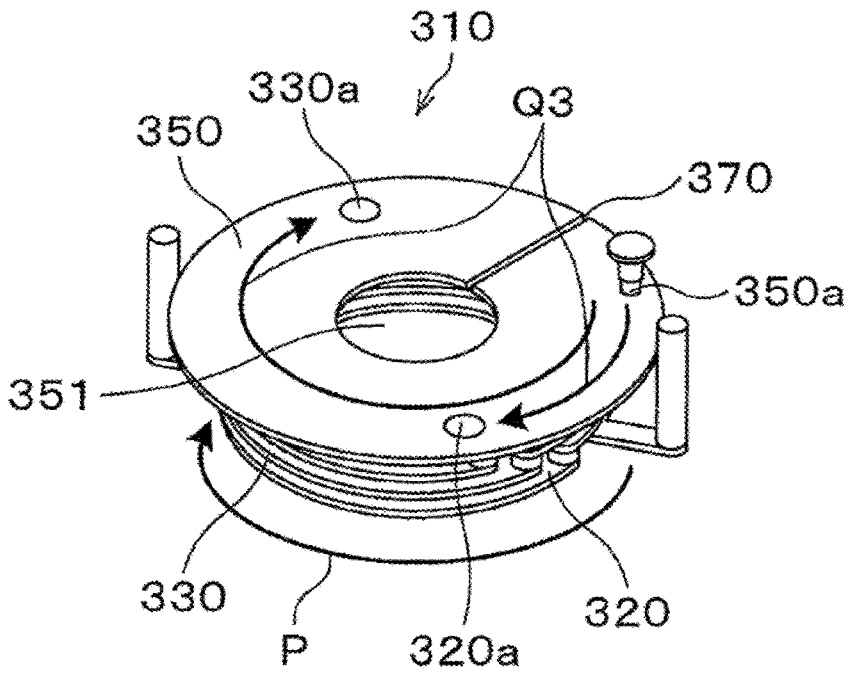
FIG. 31 explains a current flowing through a conductive plate in the third embodiment.

In a pattern 3, the slit 370 is formed near the plate terminal 350a in plan view as shown in FIG. 31. In that case, the entire induced current Q3 flows in the same direction as that of the current P, so that the efficiency E3 increases. However, the bias B3 of the pattern 3 becomes further greater than the bias B2 of the pattern 2.

Pattern 4

Figure 32:
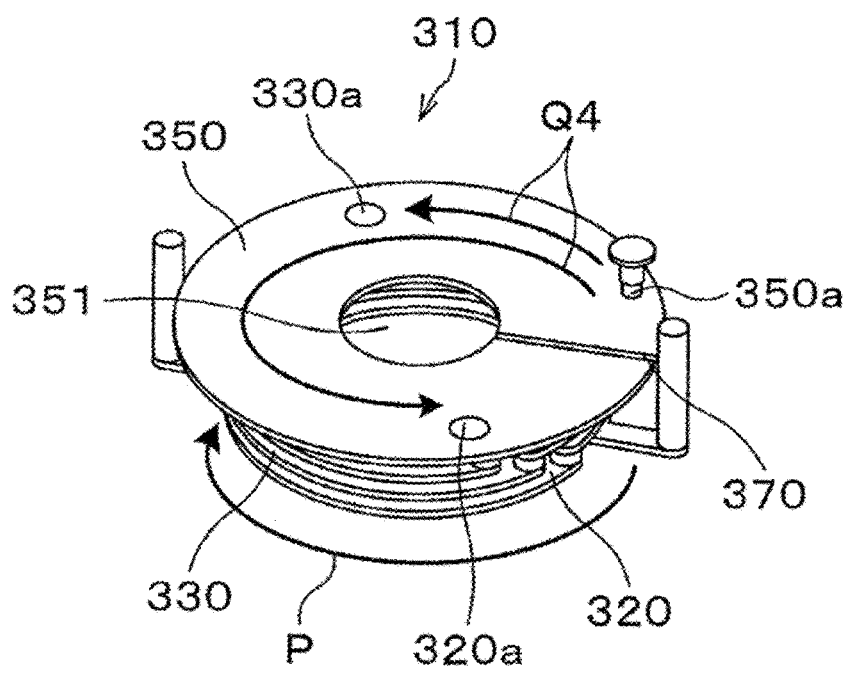
FIG. 32 explains a current flowing through a conductive plate in the third embodiment.

In a pattern 4, the slit 370 is formed between the plate terminal 350a and the first upper coil terminal 320a in plan view as shown in FIG. 32. In that case, the entire induced current Q4 flows in the opposite direction to that of the current P, so that the efficiency E4 decreases. However, the bias B4 of the pattern 4 can be suppressed.

To sum up, the bias B satisfies a relationship of B1<B4<B2<B3. On the other hand, the efficiency E satisfies a relationship of E3>E2>E4>E1. The existence/non-existence and position of the slit 370 are appropriately designed such that the bias B and the efficiency E satisfy the specifications.

The slit 370 formed in the conductive plate 350 in the second embodiment may be formed in the inner conductive plate 210 in the first embodiment. In that case as well, the above-described effect can be obtained.

Although the sub-antenna 310 is inductively coupled with the main coil 300, the present disclosure is not limited thereto. The sub-antenna 310 may be capacitively coupled with the main coil 300.

Although the sub-antenna 310 is disposed at the radially inner side of the main coil 300, the present disclosure is not limited thereto. The sub-antenna 310 may be disposed at a radially outer side of the main coil 300, or may be disposed to overlap the main coil 300 in plan view. Hereinafter, such modifications will be described with reference to FIGS. 33 to 36.

Figure 33:
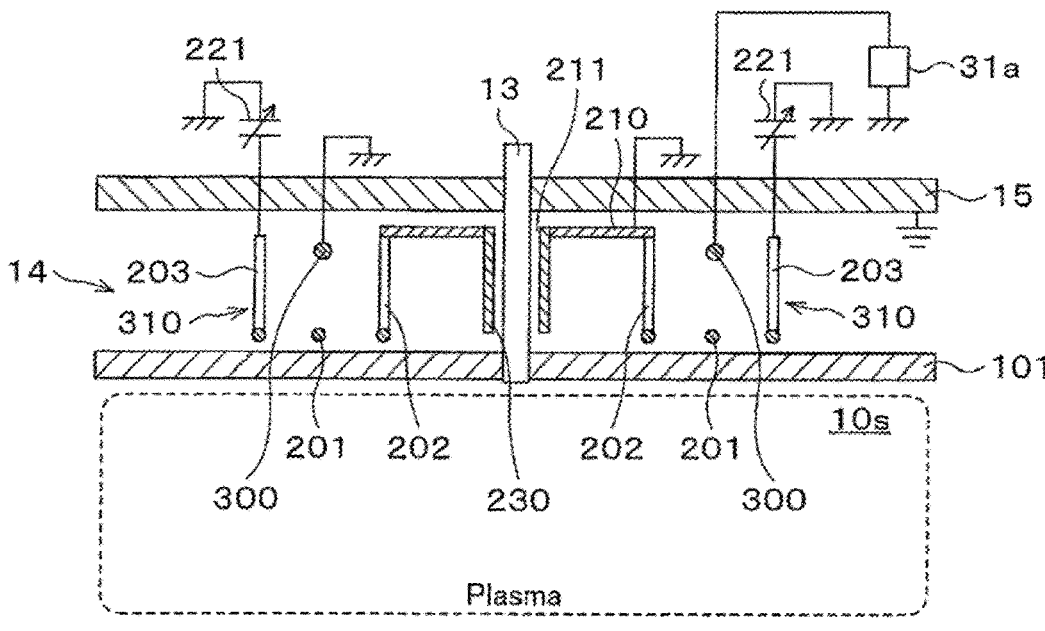
FIG. 33 is a cross-sectional view showing a schematic configuration of an antenna unit according to a modification of the third embodiment.
Figure 34:
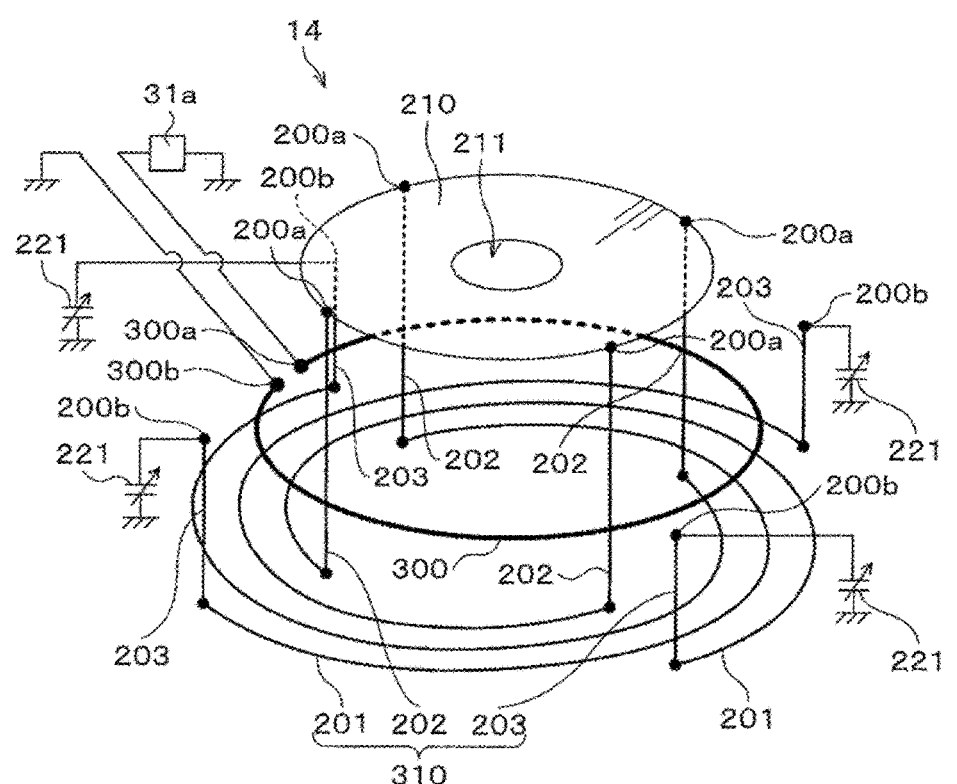
FIG. 34 is a perspective view showing the schematic configuration of the antenna unit according to the modification of the third embodiment.

FIG. 33 is a cross-sectional view schematically showing an example of a modification of the configuration of the antenna unit 14 according to the third embodiment. FIG. 34 is a perspective view of the example shown in FIG. 33, which is the example of the modification of the configuration of the antenna unit 14 according to the third embodiment. As shown in FIGS. 33 and 34, the main antenna includes one main coil 300, and the sub-antenna 310 includes the coil segment 201 and vertical coil segments 202 and 203 described in the first embodiment. The other components may be the same as those of the antenna unit 14 described in the first embodiment. In the examples of FIGS. 33 and 34, the main coil 300 and the sub-antenna 310 are arranged above the dielectric window 101. The main coil 300 is disposed between the conductive plate 210 and the sub-antenna 310. The vertical coil segment 202 is disposed at the inner side of the main coil 300, and the vertical coil segment 203 is disposed at the outer side of the main coil 300.

Figure 35:
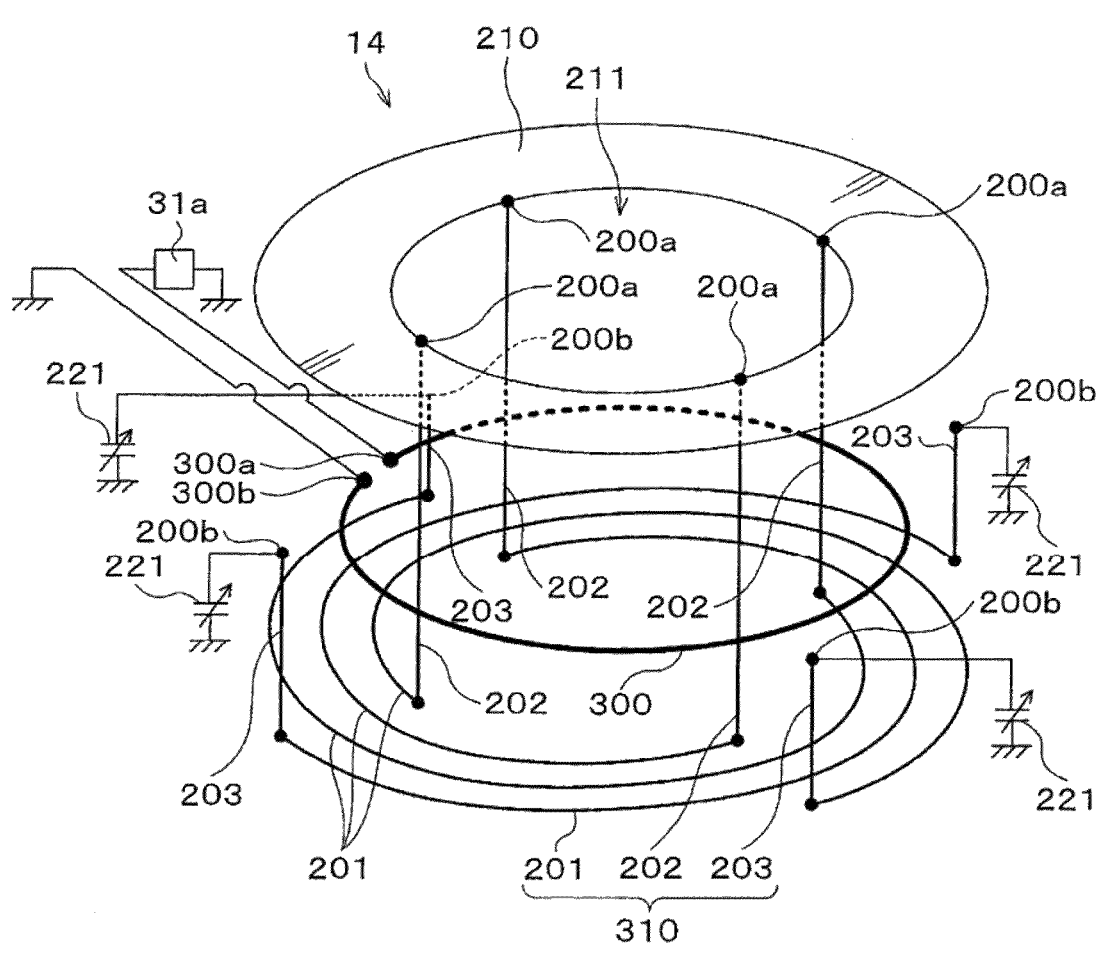
FIG. 35 is a perspective view showing the schematic configuration of the antenna unit according to the modification of the third embodiment.

FIG. 35 is a perspective view schematically showing the example of the modification of the configuration of the antenna unit 14 according to the third embodiment. As shown in FIG. 35, the main antenna includes one main coil 300, and the sub-antenna 310 includes the coil segment 201 and vertical coil segments 202 and 203 described in the first embodiment. The other components may be the same as those of the antenna unit 14 described in the first embodiment. In the example of FIG. 35, the inner ends of the sub-antenna 310 are connected, as the coil terminals 200a, to the inner peripheral portion of the central opening 211 in the conductive plate 210, and the outer ends of the sub-antenna 310 are connected, as the coil terminals 200b, to the ground potential through the impedance adjusting part.

Figure 36:
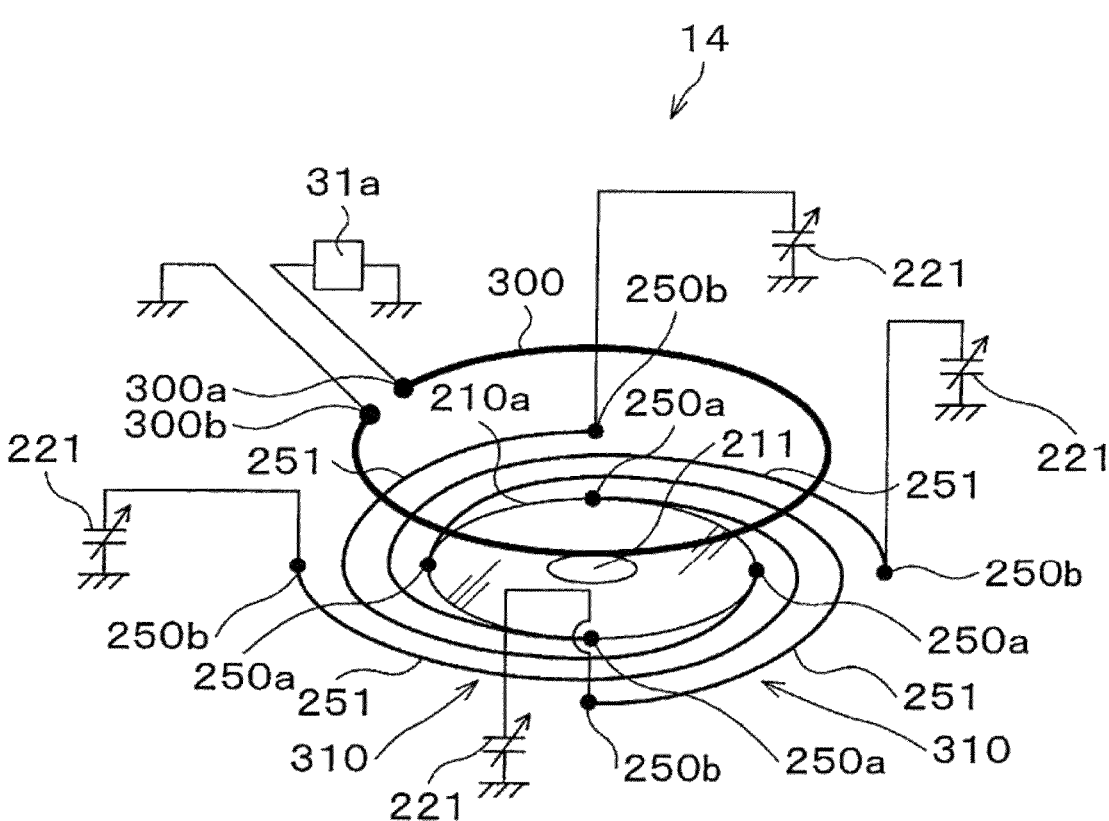
FIG. 36 is a perspective view showing the schematic configuration of the antenna unit according to the modification of the third embodiment.

FIG. 36 is a perspective view schematically showing the example of the modification of the configuration of the antenna unit 14 according to the third embodiment. As shown in FIG. 36, the main antenna includes one main coil 300 and the sub-antenna 310 includes the coil segments 251 described in the second embodiment. The other components may be the same as those of the antenna unit 14 described in the second embodiment. In the example of FIG. 36, the main coil 300 is disposed above the conductive plate 210 and the sub-antenna 310 to overlap the conductive plate 210 and the sub-antenna 310 in plan view.

The above-described embodiments are illustrative in all respects and are not restrictive. The above-described embodiments may be omitted, replaced, or changed in various forms without departing from the scope of the appended claims and the gist thereof.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

The invention claimed is:

1. An antenna for inductively coupled plasma excitation, the antenna comprising:
a conductive plate;
a conductive cylindrical member provided at a center of the conductive plate and extending below the conductive plate at a right angle to a plane of the conductive plate, one end of the conductive cylindrical member being open;
a plurality of coil assemblies, one end of each of the plurality of coil assemblies being connected to the conductive plate; and
an impedance adjusting part disposed between the other end of each of the plurality of coil assemblies and the ground.

2. The antenna for inductively coupled plasma excitation of claim 1, wherein the plurality of coil assemblies are arranged to be rotationally symmetrical with respect to the center of the conductive plate.

3. The antenna for inductively coupled plasma excitation of claim 1, wherein the plurality of coil assemblies are arranged at equal intervals in a circumferential direction of the conductive plate.

4. The antenna for inductively coupled plasma excitation of claim 1, wherein the one end and the other end of the one ends and the other ends of the plurality of coil assemblies are arranged on the same circumference.

5. The antenna for inductively coupled plasma excitation of claim 1, wherein one ends and the other ends of the plurality of coil assemblies are arranged on two different circumferences, and the two circumferences form concentric circles.

6. The antenna for inductively coupled plasma excitation of claim 1, wherein the plurality of coil assemblies have an algebraic spiral shape or a logarithmic spiral shape.

7. The antenna for inductively coupled plasma excitation of claim 6, wherein the algebraic spiral shape is an Archimedean spiral shape or a parabolic spiral shape.

8. The antenna for inductively coupled plasma excitation of claim 1, wherein the conductive plate has a central opening.

9. The antenna for inductively coupled plasma excitation of claim 8, wherein the conductive plate has a slit extending from an outer edge of the conductive plate to the central opening.

10. The antenna for inductively coupled plasma excitation of claim 8, wherein the plurality of coil assemblies are arranged at an inner side of the central opening of the conductive plate, and have one ends connected to an inner circumference of the conductive plate, the inner circumference of the conductive plate forming the central opening.

11. The antenna for inductively coupled plasma excitation of claim 8, wherein the plurality of coil assemblies are arranged to at least partially overlap with the conductive plate in plan view, and have one ends connected to an inner peripheral portion of the conductive plate that forms the central opening.

12. The antenna for inductively coupled plasma excitation of claim 8, wherein the conductive cylindrical member is attached to the conductive plate at the central opening.

13. The antenna for inductively coupled plasma excitation of claim 8, further comprising a conductor plate disposed above the conductive plate,
wherein a distance between the conductive plate and the conductor plate is smaller than a diameter of the central opening.

14. The antenna for inductively coupled plasma excitation of claim 1, wherein the plurality of the coil assemblies are arranged at an outer peripheral portion of the conductive plate, and one ends of the plurality of coil assemblies are connected to the outer peripheral portion of the conductive plate.

15. The antenna for inductively coupled plasma excitation of claim 1, wherein the plurality of coil assemblies are arranged to at least partially overlap with the conductive plate in plan view, and have one ends connected to the outer peripheral portion of the conductive plate.

16. The antenna for inductively coupled plasma excitation of claim 1, wherein the plurality of impedance adjusting parts include variable capacitance capacitors.

17. The antenna for inductively coupled plasma excitation of claim 1, wherein the plurality of coil assemblies are disposed on the same plane as the conductive plate.

18. The antenna for inductively coupled plasma excitation of claim 1, wherein the plurality of coil assemblies are arranged such that one end of one coil assembly that is connected to the conductive plate is surrounded by another coil assembly in plan view.

19. The antenna for inductively coupled plasma excitation of claim 1, wherein the conductive plate of the antenna is configured to be disposed near a conductor plate of a plasma processing apparatus at a distance smaller than a diameter of a central opening in the conductive plate of the antenna.

20. The antenna for inductively coupled plasma excitation of claim 1, wherein the other end of the conductive cylindrical member is connected to the conductive plate.

21. The antenna for inductively coupled plasma excitation of claim 1, wherein the other end of the conductive cylindrical member is not connected to the conductive plate.

22. The antenna for inductively coupled plasma excitation of claim 1, further comprising a conductor plate disposed above the conductive plate,
wherein a distance between the conductive plate and the conductor plate is shorter than a distance between the conductive plate and the plurality of coil assemblies.

23. An antenna unit for inductively coupled plasma excitation, the antenna unit comprising:
a main antenna having a power feed terminal connected to an RF potential;
a sub-antenna disposed at a position that is inductively coupled or capacitively coupled with the main antenna;
wherein the sub-antenna includes:
a conductive plate;
a conductive cylindrical member provided at a center of the conductive plate and extending below the conductive plate at a right angle to a plane of the conductive plate, one end of the conductive cylindrical member being open;
a plurality of coil assemblies arranged at an outer peripheral portion of the conductive plate and having one ends connected to the conductive plate; and
an impedance adjusting part disposed between the other end of each of the plurality of coil assemblies and the ground.

24. The antenna unit for inductively coupled plasma excitation of claim 23, wherein the other end of the conductive cylindrical member is connected to the conductive plate.

25. The antenna unit for inductively coupled plasma excitation of claim 23, wherein the other end of the conductive cylindrical member is not connected to the conductive plate.

26. A plasma processing apparatus, comprising:

a plasma processing chamber;

a hollow member attached to the plasma processing chamber; and an antenna for inductively coupled plasma excitation that is disposed on or above the plasma processing chamber to surround the hollow member, wherein the antenna for inductively coupled plasma excitation includes:

a conductive plate;

a conductive cylindrical member provided at a center of the conductive plate and extending below the conductive plate at a right angle to a plane of the conductive plate, one end of the conductive cylindrical member being open;

a plurality of coil assemblies having one ends connected to the conductive plate; and an impedance adjusting part disposed between the other end of each of the plurality of coil assemblies and the ground.

27. The plasma processing apparatus of claim 26, wherein the other end of the conductive cylindrical member is connected to the conductive plate.

28. The plasma processing apparatus of claim 26, wherein the other end of the conductive cylindrical member is not connected to the conductive plate.

29. An antenna for inductively coupled plasma excitation, the antenna comprising:

a conductive plate;

a plurality of coil assemblies, one end of each of the plurality of coil assemblies being connected to the conductive plate; and an impedance adjusting part disposed between the other end of each of the plurality of coil assemblies and the ground, wherein the conductive plate has a central opening, and a slit extending from an outer edge of the conductive plate to the central opening.

* * * * *